United States Patent
Morimoto et al.

(10) Patent No.: US 12,550,464 B2
(45) Date of Patent: Feb. 10, 2026

(54) PHOTOELECTRIC CONVERSION APPARATUS, PHOTOELECTRIC CONVERSION SYSTEM, AND MOVABLE BODY

(71) Applicant: CANON KABUSHIKI KAISHA, Tokyo (JP)

(72) Inventors: Kazuhiro Morimoto, Kanagawa (JP); Junji Iwata, Tokyo (JP); Taikan Kanou, Kanagawa (JP)

(73) Assignee: Canon Kabushiki Kaisha, Tokyo (JP)

(*) Notice: Subject to any disclaimer, the term of this patent is extended or adjusted under 35 U.S.C. 154(b) by 627 days.

(21) Appl. No.: 17/933,025

(22) Filed: Sep. 16, 2022

(65) Prior Publication Data
US 2023/0090385 A1    Mar. 23, 2023

(30) Foreign Application Priority Data
Sep. 22, 2021 (JP) .............................. JP2021-154431

(51) Int. Cl.
*H10F 39/00*    (2025.01)

(52) U.S. Cl.
CPC ....... *H10F 39/805* (2025.01); *H10F 39/8033* (2025.01); *H10F 39/807* (2025.01); *H10F 39/811* (2025.01)

(58) Field of Classification Search
CPC .. H10F 39/805; H10F 39/8033; H10F 39/807; H10F 39/811; H10F 39/18;
(Continued)

(56) References Cited

U.S. PATENT DOCUMENTS 5,511,428 A * 4/1996 Goldberg .............. G01L 9/0073
  73/777
5,721,613 A * 2/1998 Linowski ............... G01N 30/74
  250/461.1
(Continued)

FOREIGN PATENT DOCUMENTS

EP    3879573 A1    9/2021
JP    2004200328 A    7/2004
(Continued)

OTHER PUBLICATIONS

G. D. Wilk et al., High-k gate dielectrics: Current status and materials properties considerations, Journal of applied physics, pp. 5243-5275, May 15, 2001, vol. 89, No. 10.
(Continued)

*Primary Examiner* — Tucker J Wright
(74) *Attorney, Agent, or Firm* — Canon U.S.A., Inc. IP Division

(57) ABSTRACT

A photoelectric conversion apparatus comprising an avalanche diode disposed in a semiconductor layer having a first surface and a second surface opposite the first surface. The avalanche diode includes a first semiconductor region of first conductivity type disposed at a first depth and a second semiconductor region of second conductivity type disposed at a second depth deeper than the first depth with respect to the second surface. An oxide film and a protective film stacked on the oxide film are disposed on the second surface of the semiconductor layer. There is a point at which $d_{sio} > (\varepsilon_{sio}/\varepsilon_{prot}) \times d_{prot}/2$ is satisfied, where $d_{sio}$ is a thickness of the oxide film, $d_{prot}$ is a thickness of the protective film, $\varepsilon_{sio}$ is a relative permittivity of the oxide film, and $\varepsilon_{prot}$ is a relative permittivity of the protective film.

26 Claims, 18 Drawing Sheets

(58) Field of Classification Search
CPC ...... H10F 30/225; H10F 77/14; H10F 77/306; H04N 25/773

See application file for complete search history.

(56) References Cited

U.S. PATENT DOCUMENTS

| | | | |
|---|---|---|---|
| 7,863,647 B1 * | 1/2011 | Veliadis | H10F 77/147 257/466 |
| 2009/0273008 A1 | 11/2009 | Moon | |
| 2020/0020734 A1 | 1/2020 | Wang | |
| 2020/0152807 A1 | 5/2020 | Röhrer | |
| 2021/0043792 A1 | 2/2021 | Iwata | |
| 2021/0057463 A1 | 2/2021 | Iwata | |
| 2021/0159256 A1 | 5/2021 | Tsuboi | |
| 2024/0072192 A1 | 2/2024 | Jibiki | |

FOREIGN PATENT DOCUMENTS

| | | |
|---|---|---|
| JP | 2005-259804 A | 9/2005 |
| JP | 2019-033136 A | 2/2019 |
| JP | 2020-161716 A | 10/2020 |
| JP | 2021-111692 A | 8/2021 |
| JP | 2022-113371 A | 8/2022 |
| TW | 484235 B | 4/2002 |
| TW | 200721521 A | 6/2007 |
| TW | 201218762 A | 5/2012 |
| WO | 2020/083082 A1 | 4/2020 |
| WO | 2021153362 A1 | 8/2021 |

OTHER PUBLICATIONS

J. Appenzeller et al., Ultrathin 600° C. Wet Thermal Silicon Dioxide, Electrochemical and Solid-State Letters, pp. 84-86, vol. 3.

* cited by examiner

I. WITH THIN OXIDE FILM    II. WITH THICK OXIDE FILM

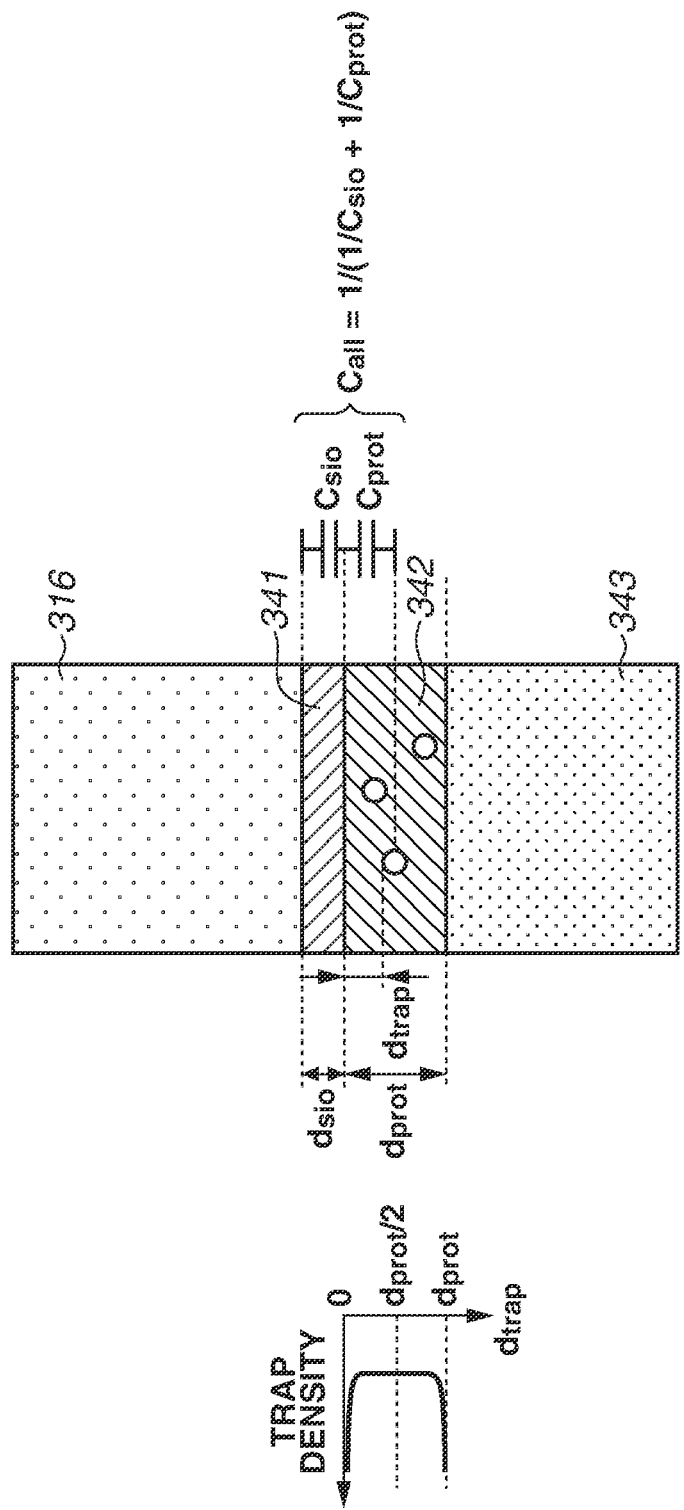

PHOTOELECTRIC CONVERSION APPARATUS, PHOTOELECTRIC CONVERSION SYSTEM, AND MOVABLE BODY

BACKGROUND

Field of the Embodiment

The present invention relates to a photoelectric conversion apparatus, a photoelectric conversion system, and a movable body.

Description of the Related Art

United States Patent Application Publication No. 2020/0152807 discusses a single photon avalanche diode (SPAD) that includes a protective film formed of an oxide film, a nitride film, or a combination of these on a silicon substrate surface.

SUMMARY

According to an aspect of the present invention, a photoelectric conversion apparatus includes an avalanche diode disposed in a semiconductor layer having a first surface and a second surface opposite the first surface. The avalanche diode includes a first semiconductor region of first conductivity type disposed at a first depth and a second semiconductor region of second conductivity type disposed at a second depth deeper than the first depth with respect to the second surface. An oxide film and a protective film stacked on the oxide film are disposed on the second surface of the semiconductor layer. There is a point at which $d_{sio} > (\varepsilon_{sio}/\varepsilon_{prot}) \times d_{prot}/2$ is satisfied, where $d_{sio}$ is a thickness of the oxide film, $d_{prot}$ is a thickness of the protective film, $\varepsilon_{sio}$ is a relative permittivity of the oxide film, and $\varepsilon_{prot}$ is a relative permittivity of the protective film.

According to another aspect of the present invention, a photoelectric conversion apparatus includes an avalanche diode disposed in a semiconductor layer having a first surface and a second surface opposite the first surface. The avalanche diode includes a first semiconductor region of first conductivity type disposed at a first depth and a second semiconductor region of second conductivity type disposed at a second depth deeper than the first depth with respect to the second surface. An oxide film and a protective film stacked on the oxide film are disposed on the second surface of the semiconductor layer. The protective film includes silicon nitride and satisfies $d_{sio} > 15$ nm, where $d_{sio}$ is a thickness of the oxide film, $d_{prot}$ is a thickness of the protective film, $\varepsilon_{sio}$ is a relative permittivity of the oxide film, and $\varepsilon_{prot}$ is a relative permittivity of the protective film.

Further features of the present invention will become apparent from the following description of embodiments with reference to the attached drawings.

BRIEF DESCRIPTION OF THE DRAWINGS

FIG. 10 is an enlarged view of a protective film according to the first embodiment.

DESCRIPTION OF THE EMBODIMENTS

Figure 1:
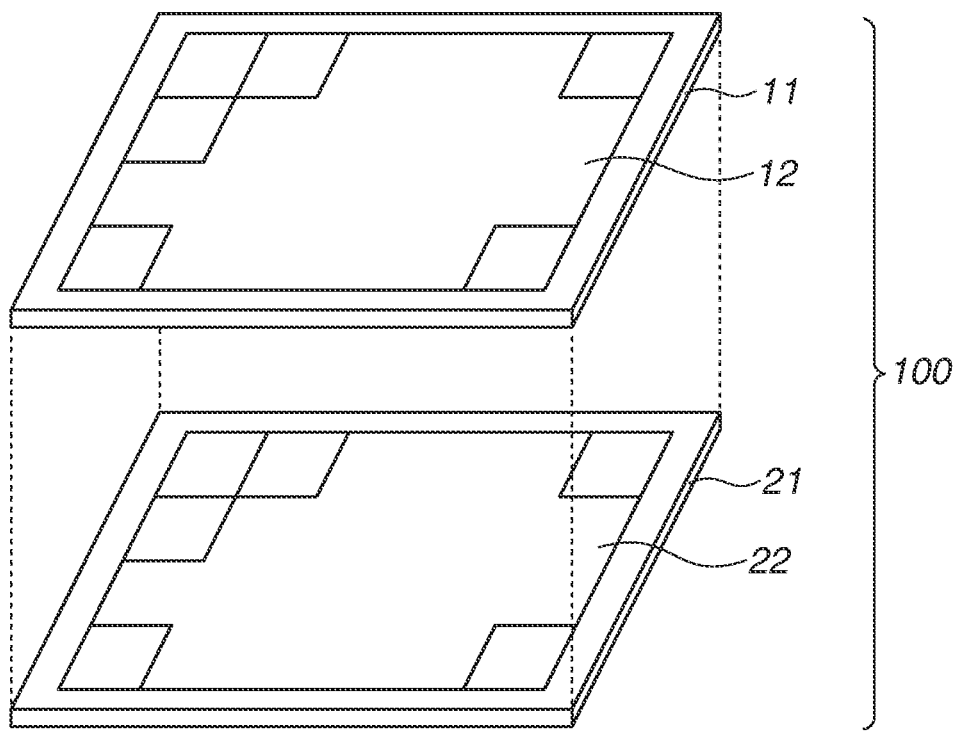
FIG. 1 is a schematic diagram illustrating a photoelectric conversion apparatus according to an embodiment.

The modes described below are intended to embody the technical concept of the present invention and not limit the present invention. For clarity of description, members illustrated in the drawings may be exaggerated in size and/or positional relationship. In the following description, similar components may be denoted by the same reference numerals, and a description thereof may be omitted.

embodiments of the present invention will be described in detail below with reference to the accompanying drawings. In the following description, terms describing specific directions or positions (such as "up", "down", "right", and "left", and other phrases including these terms) are used as appropriate. Such terms and phrases are only used to facilitate the understanding of the embodiments with reference to the drawings, and the technical scope of the present invention is not limited by the meaning of the terms or phrases.

As employed herein, a plan view refers to a view taken in a direction perpendicular to the light incident surface of a semiconductor layer. A cross section refers to a plane in the direction perpendicular to the light incident surface of the semiconductor layer. If the light incident surface of the semiconductor layer is microscopically rough, the plan view is defined with reference to the light incident surface of the semiconductor layer seen microscopically.

In the following description, the anode of an avalanche photodiode (APD) is fixed to a potential, and a signal is taken out of the cathode. A semiconductor region of first conductivity type where charges having the same polarity as that of the signal charge are the majority carriers thus refers to a N-type semiconductor region. A semiconductor region of second conductivity type where charges having the opposite polarity to that of the signal charge are the majority carriers refers to a P-type semiconductor region.

An embodiment of the present invention also holds if the cathode of an APD is fixed to a potential and a signal is taken out of the anode. In such a case, a semiconductor region of the first conductivity type where charges having the same polarity as that of the signal charge are the majority carriers refers to a P-type semiconductor region. A semiconductor region of the second conductivity type where charges having the opposite polarity to that of the signal charge are the majority carriers refers to a N-type semiconductor region. While in the following description either one of the nodes of an APD is fixed to a potential, both nodes may be variable in potential.

As employed herein, "impurity concentration" refers to the net impurity concentration compensated for impurities of opposite conductivity type. In other words, the "impurity concentration" refers to a net doping concentration. A region where the P-type doping impurity concentration is higher than the N-type doping impurity concentration is a P-type semiconductor region. On the other hand, a region where the N-type doping impurity concentration is higher than the P-type doping impurity concentration is a N-type semiconductor region.

A configuration common to embodiments of a photoelectric conversion apparatus and a driving method thereof according to the present invention will be described with reference to FIGS. 1 to 5C.

FIG. 1 is a diagram illustrating a configuration of a stacked photoelectric conversion apparatus 100 according to an embodiment of the present invention.

The photoelectric conversion apparatus 100 includes two substrates, namely, a sensor substrate 11 and a circuit substrate 21, that are stacked and electrically connected to each other. The sensor substrate 11 includes a first semiconductor layer including photoelectric conversion elements 102 to be described below, and a first wiring structure. The circuit substrate 21 includes a second semiconductor layer including circuits such as signal processing units 103 to be described below, and a second wiring structure. The photoelectric conversion apparatus 100 is constituted by the second semiconductor layer, the second wiring structure, the first wiring structure, and the first semiconductor layer being stacked in order. The photoelectric conversion apparatus described in each of the following embodiments is a back-illuminated photoelectric conversion apparatus on a first side of which light is incident and on a second side of which the circuit substrate is located.

In the following description, the sensor substrate 11 and the circuit substrate 21 are described as diced chips. However, the sensor substrate 11 and the circuit substrate 21 are not limited to chips. For example, the substrates may be wafers. The substrates in a wafer state may be stacked before dicing. Diced chips may be stacked and bonded.

The sensor substrate 11 includes a pixel region 12. The circuit substrate 21 includes a circuit region 22 for processing signals detected in the pixel region 12.

Figure 2:
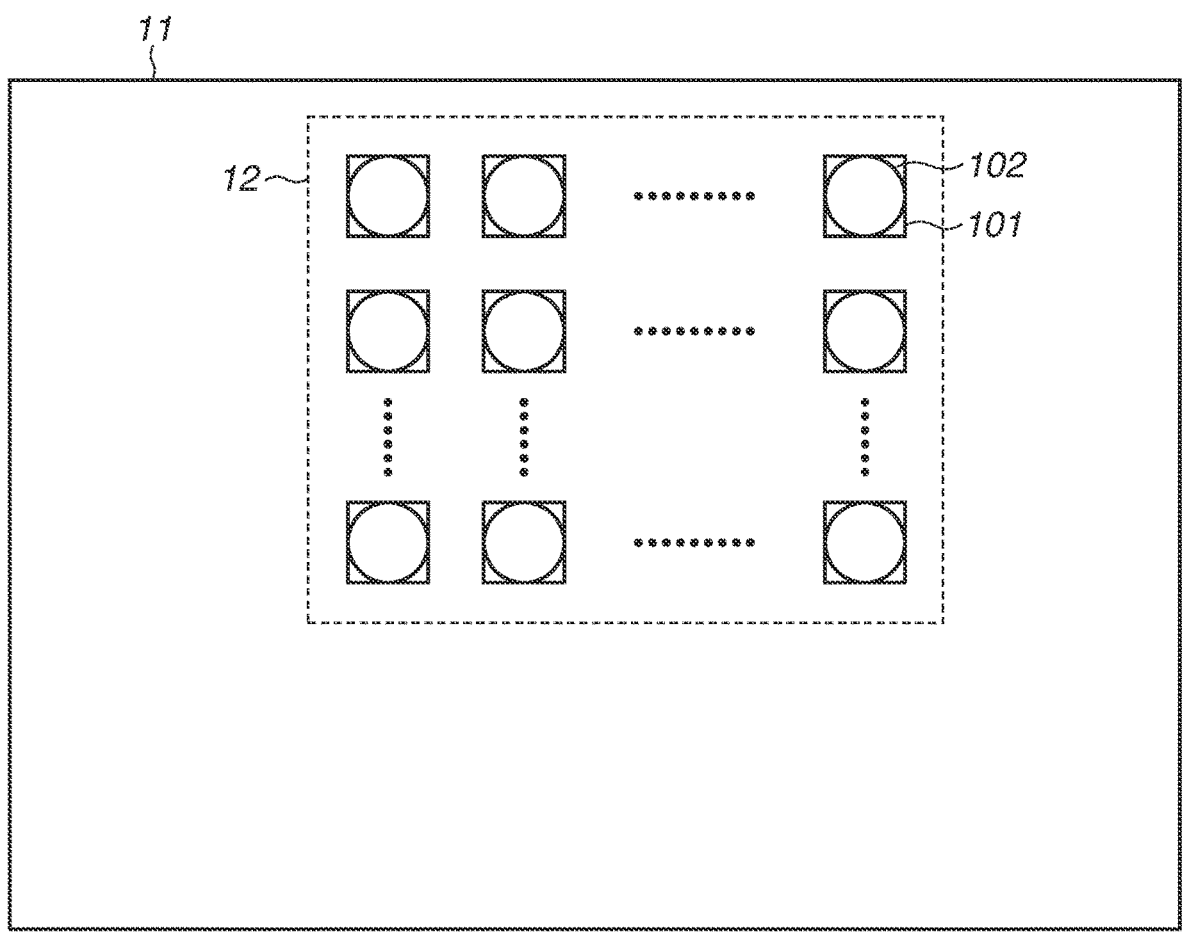
FIG. 2 is a schematic diagram illustrating a photodiode (PD) substrate (sensor substrate) of the photoelectric conversion apparatus according to an embodiment.

FIG. 2 is a diagram illustrating a layout example of the sensor substrate 11. Pixels 101 each including a photoelectric conversion element 102 including an APD are arranged in a two-dimensional array in a plan view, thus forming the pixel region 12.

Typically, the pixels 101 are used for forming an image. However, in time of flight (TOF) applications, the pixels 101 do not necessarily need to form an image. More specifically, the pixels 101 may be ones for measuring the time of arrival of light and an amount of the light.

Figure 3:
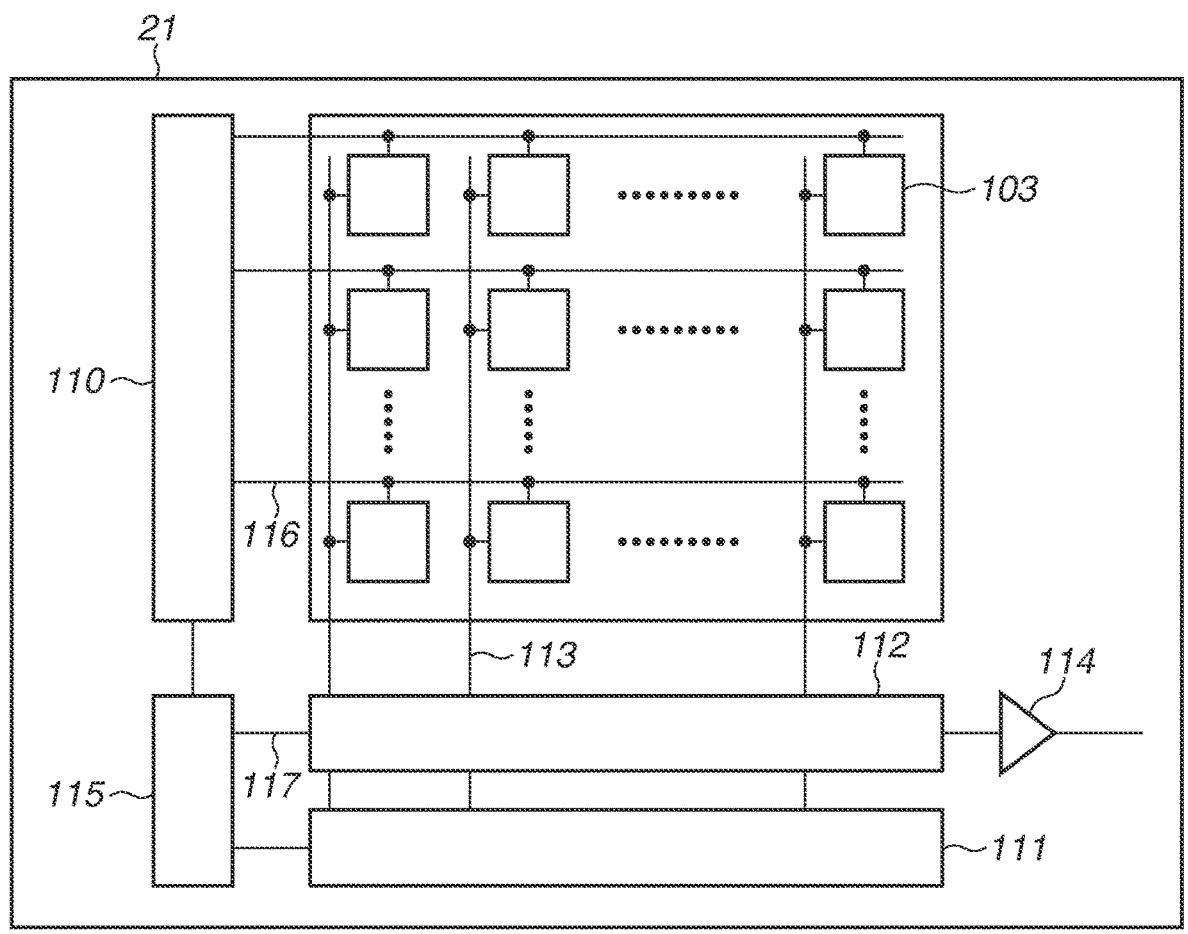
FIG. 3 is a schematic diagram illustrating a circuit substrate of the photoelectric conversion apparatus according to an embodiment.

FIG. 3 is a configuration diagram of the circuit substrate 21. The circuit substrate 21 includes signal processing units 103 for processing charges photoelectrically converted by the photoelectric conversion elements 102 in FIG. 2, a reading circuit (column circuit) 112, a control pulse generation unit 115, a horizontal scanning circuit unit 111, signal lines 113, and a vertical scanning circuit unit 110.

The photoelectric conversion elements 102 in FIG. 2 and the signal processing units 103 in FIG. 3 are electrically connected via connection wiring disposed for each pixel.

The vertical scanning circuit unit 110 receives control pulses supplied from the control pulse generation unit 115 and supplies the control pulses to the pixels 101. Logic circuits, such as a shift register and an address decoder, are used for the vertical scanning circuit unit 110.

The signals output from the photoelectric conversion elements 102 of the pixels 101 are processed by the signal processing units 103. The signal processing units 103 each include a counter and a memory. The memory stores a digital value (digital signal).

The horizontal scanning circuit unit 111 inputs control pulses for sequentially selecting columns to the signal processing units 103 to read the digital signals stored in the memories of the respective pixels, in which the digital signals are stored.

The signal processing unit 103 of the pixel selected by the vertical scanning circuit unit 110 in the selected column outputs a signal (digital signal) to the signal line 113.

The signal output to the signal line 113 is output to a recording unit or signal processing unit outside the photoelectric conversion apparatus 100 via an output circuit 114.

In FIG. 2, the photoelectric conversion elements 102 may be one-dimensionally arranged in the pixel region 12. The effects of the present embodiment can be obtained even with one pixel 101, and the case with only one pixel 101 is also included in the present invention. The functions of the signal processing units 103 do not necessarily need to be provided for all the photoelectric conversion elements 102 on a one-on-one basis. For example, a plurality of photoelectric conversion elements 102 may share one signal processing unit 103 and the signal processing may be sequentially performed.

As illustrated in FIGS. 2 and 3, the plurality of signal processing units 103 is disposed in a region overlapping the pixel region 12 in a plan view. The vertical scanning circuit unit 110, the horizontal scanning circuit unit 111, the column circuit 112, the output circuit 114, and the control pulse generation unit 115 are disposed to overlap the area between the ends of the sensor substrate 11 and the ends of the pixel region 12 in a plan view. In other words, the sensor substrate 11 includes the pixel region 12 and a non-pixel region located around the pixel region 12. The vertical scanning circuit unit 110, the horizontal scanning circuit unit 111, the column circuit 112, the output circuit 114, and the control pulse generation unit 115 are disposed in an area overlapping the non-pixel region in a plan view.

Figure 4:
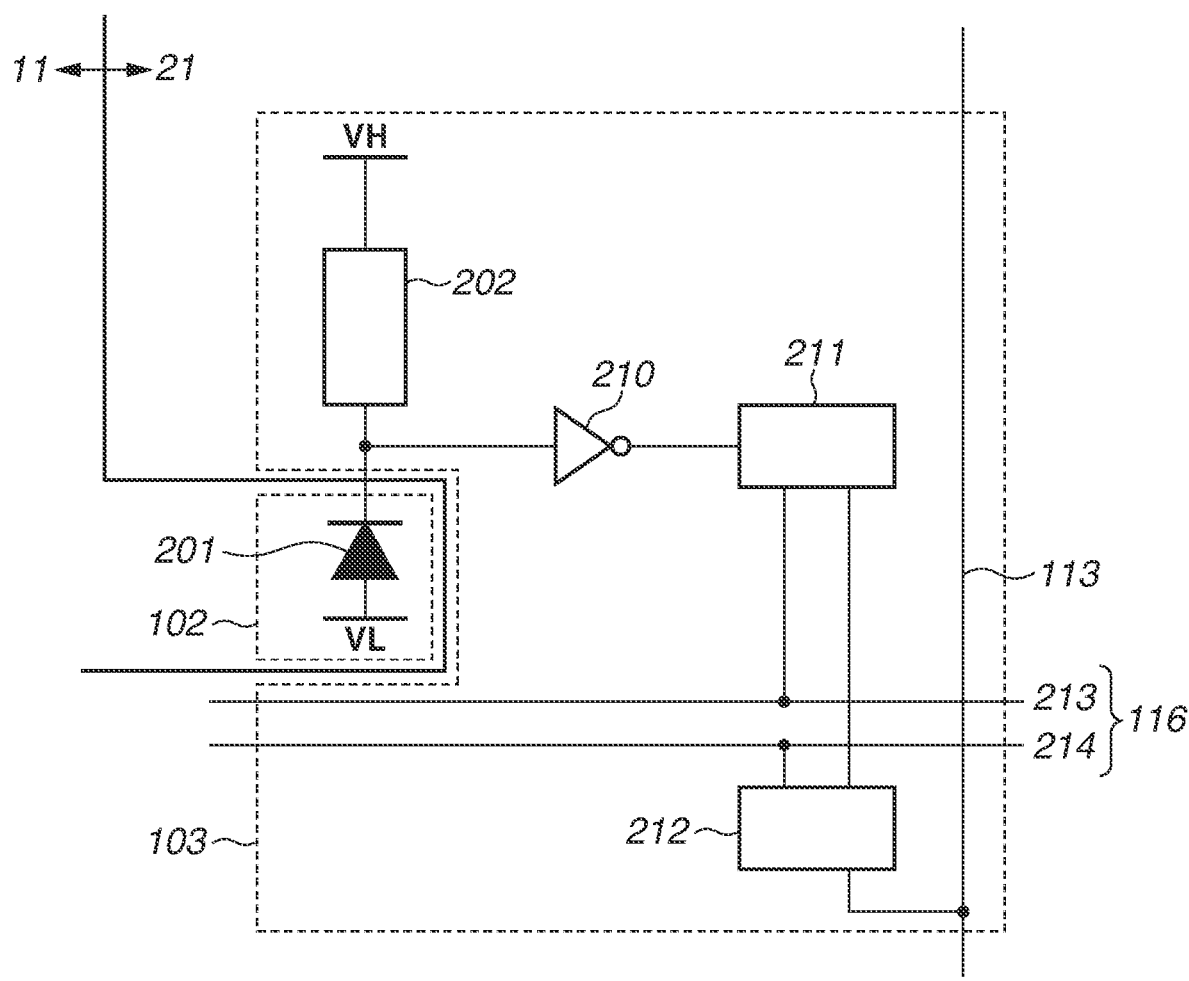
FIG. 4 illustrates a configuration example of a pixel circuit of the photoelectric conversion apparatus according to an embodiment.

FIG. 4 is an example of a block diagram including an equivalent circuit in FIGS. 2 and 3.

In FIG. 2, the photoelectric conversion elements 102 including the APDs 201 are disposed on the sensor substrate 11. The other members are disposed on the circuit substrate 21.

Each APD 201 generates charge pairs corresponding to incident light by photoelectrical conversion. A voltage VL (first voltage) is supplied to the anode of the APD 201. A voltage VH (second voltage) higher than the voltage VL to be supplied to the anode is supplied to the cathode of the APD 201. A reverse bias voltage for causing an avalanche multiplication operation of the APD 201 is supplied to the anode and the cathode. With such a voltage supplied, the charges generated by the incident light cause avalanche multiplication, thus generating an avalanche current.

The reverse bias voltage can be supplied in a Geiger mode and a linear mode. In the Geiger mode, the APD 201 operates with a potential difference greater than its breakdown voltage between the anode and the cathode. In the linear mode, the APD 201 operates with a potential difference near the breakdown voltage or less between the anode and the cathode.

An APD operating in the Geiger mode is referred to as a single-photon avalanche diode (SPAD). For example, the voltage VL (first voltage) is −30 V, and the voltage VH (second voltage) is 1 V. The APD 201 may be operated in the linear mode or the Geiger mode. The SPAD is desirable since the SPAD has a high potential difference and a significant withstanding effect compared to the APD in the linear mode.

A quenching element 202 is connected to a power supply for supplying the voltage VH and the APD 201. In multiplying a signal by avalanche multiplication, the quenching element 202 functions as a load circuit (quenching circuit) to reduce the voltage supplied to the APD 201 and suppress the avalanche multiplication (quenching operation). The quenching element 202 also has the function of restoring the voltage to be supplied to the APD 201 to the voltage VH (recharging operation) by passing a current as much as the voltage drop caused by the quenching operation.

The signal processing unit 103 includes a waveform shaping unit 210, a counter circuit 211, and a selection circuit 212. As employed herein, the signal processing unit 103 desirably includes at least any one of the waveform shaping unit 210, the counter circuit 211, and the selection circuit 212.

The waveform shaping unit 210 shapes the waveform of a change occurring in the potential of the cathode of the APD 201 in detection of a photon and outputs a pulse signal. An example of the waveform shaping unit 210 is an inverter circuit. FIG. 4 illustrates an example where an inverter is used as the waveform shaping unit 210, whereas a circuit including a plurality of inverters connected in series may be used. Other circuits having the waveform shaping effect may be used.

The counter circuit 211 counts the pulse signal output from the waveform shaping unit 210 and holds the count value. The signal (count value) held in the counter circuit 211 is reset when a control pulse pRES is supplied via a drive line 213.

A control pulse pSEL is supplied from the vertical scanning circuit unit 110 in FIG. 3 to the selection circuit 212 via a drive line 214 in FIG. 4 (not illustrated in FIG. 3). The selection circuit 212 switches electrical connection and disconnection between the counter circuit 211 and the signal line 113. The selection circuit 212 includes a buffer circuit for outputting a signal, for example.

Switches such as a transistor may be disposed between the quenching element 202 and the APD 201 and between the photoelectric conversion element 102 and the signal processing unit 103 to switch the electrical connection. Similarly, the supply of the voltage VH or VL to the photoelectric conversion element 102 may be electrically switched using a switch such as a transistor.

The present embodiment deals with the configuration using the counter circuit 211. However, the photoelectric conversion apparatus 100 may be configured to obtain pulse detection timing by using a time-to-digital conversion circuit (time-to-digital converter [TDC]) and a memory instead of the counter circuits 211. Here, the generation timing for the pulse signal output from the waveform shaping unit 210 is converted into a digital signal by the TDC. To measure the timing of the pulse signal, a control pulse pREF (reference signal) is supplied from the vertical scanning circuit unit 110 in FIG. 1 to the TDC via a drive line. The TDC obtains a digital signal indicating the input timing of a signal output from each pixel 101 via the waveform shaping unit 210 in terms of relative time with reference to the control pulse pREF.

Figure 5A:
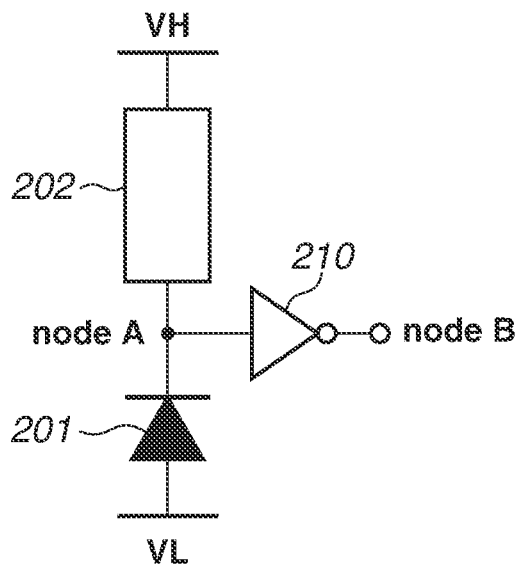
FIGS. 5A to 5C are schematic diagrams illustrating driving of the pixel circuit of the photoelectric conversion apparatus according to an embodiment.
Figure 5B:
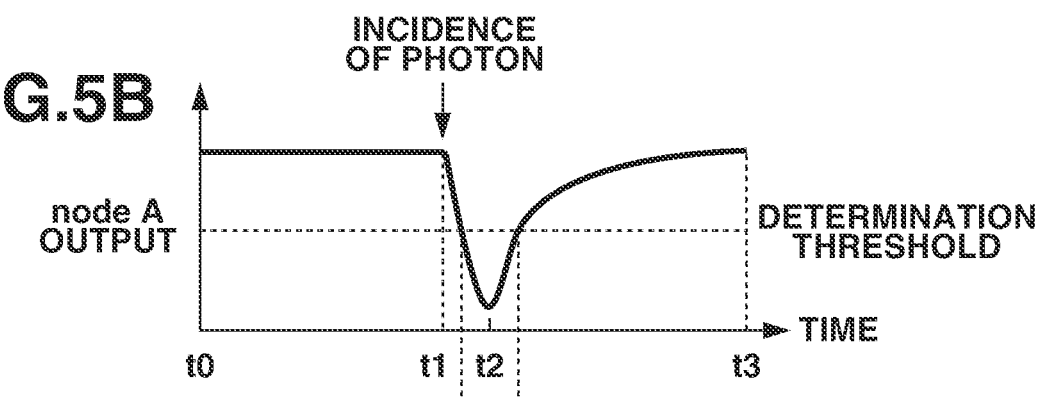
Figure 5C:
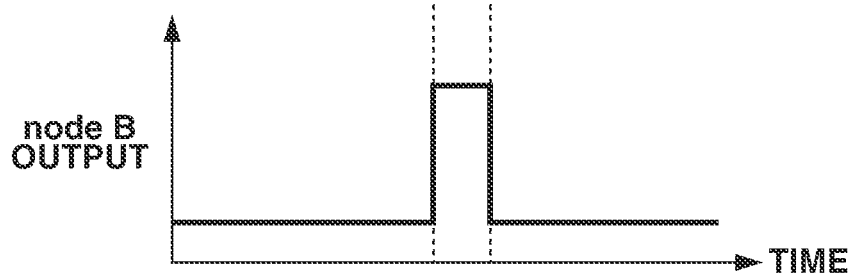

FIGS. 5A to 5C are diagrams schematically illustrating a relationship between the operation of the APD 201 and the output signal.

FIG. 5A is an excerpt illustrating the APD 201, the quenching element 202, and the waveform shaping unit 210 in FIG. 4. Here, the input node of the waveform shaping unit 210 will be referred to as node A, and the output node as node B. FIG. 5B illustrates a change in the waveform of node A in FIG. 5A, and FIG. 5C a change in the waveform of node B in FIG. 5A.

Between times t0 and t1, a potential difference of VH−VL is applied to the APD 201 in FIG. 5A. At time t1, incident of a photon on the APD 201 brings about avalanche multiplication, and an avalanche multiplication current flows through the quenching element 202 and the voltage of node A drops. The amount of voltage drop increases further to reduce the potential difference applied to the APD 201, and at time t2, the avalanche multiplication by the APD 201 stops and the voltage level of node A stops dropping beyond a certain value. Subsequently, between times t2 and t3, a current to compensate the voltage drop from the voltage VL flows through node A. At time t3, node A settles at the original potential level. The portion of the output waveform of node A falling below a certain threshold is shaped by the waveform shaping unit 210 and output to node B as a signal.

The layout of the signal lines 113 and the layout of the column circuit 112 and the output circuit 114 are not limited to those in FIG. 3. For example, the signal lines 113 may be disposed to extend in a row direction, and the column circuit 112 may be located at the end of the signal lines 113.

Photoelectric conversion apparatuses according to respective embodiments will hereinafter be described.

A first embodiment will be described below. A photoelectric conversion apparatus according to the first embodiment will be described with reference to FIGS. 6 to 10.

Figure 6:
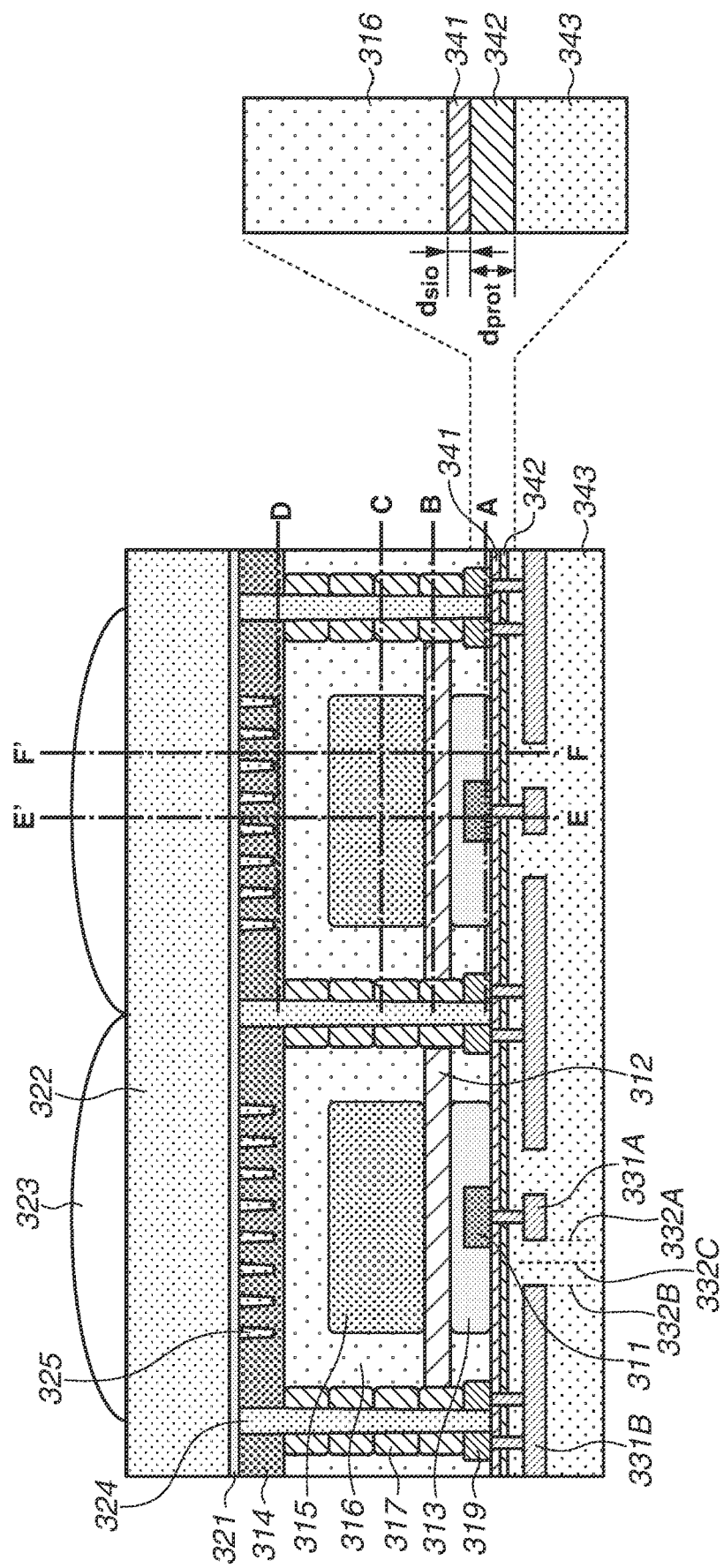
FIG. 6 is a sectional view of photoelectric conversion elements according to a first embodiment.

FIG. 6 is a sectional view of photoelectric conversion elements 102 in two pixels 101 of the photoelectric conversion apparatus according to the first embodiment, taken in a direction perpendicular to the substrate plane direction. FIG. 6 corresponds to a cross section taken along the line A-A' in FIG. 7A.

A structure and functions of the photoelectric conversion elements 102 will be described. Each photoelectric conversion element 102 includes a N-type first semiconductor region 311, a third semiconductor region 313, a fifth semiconductor region 315, and a sixth semiconductor region 316. The photoelectric conversion element 102 further includes a P-type second semiconductor region 312, a fourth semiconductor region 314, a seventh semiconductor region 317, and a ninth semiconductor region 319.

In the present embodiment, in the cross section illustrated in FIG. 6, the N-type first semiconductor region 311 is disposed near the surface opposite the light incident surface. The N-type third semiconductor region 313 is disposed around the first semiconductor region 311. The P-type second semiconductor region 312 is located to overlap the first and third regions 311 and 313 in a plan view. The N-type fifth semiconductor region 315 is further located to overlap the second semiconductor region 312 in a plan view. The N-type sixth semiconductor region 316 is disposed around the fifth semiconductor region 315.

The first semiconductor region 311 has a N-type impurity concentration higher than those of the third and fifth semiconductor regions 313 and 315. The P-type second semiconductor region 312 and the N-type first semiconductor region 311 form a PN junction therebetween. The second semiconductor region 312 has a lower impurity concentration than that of the first semiconductor region 311, so that the entire portion of the second semiconductor region 312 overlapping the center of the first semiconductor region in a plan view constitutes a depletion layer region. A potential difference between the first and second semiconductor regions 311 and 312 here is greater than that between the second and fifth semiconductor regions 312 and 315. The depletion layer region further extends into a part of the first semiconductor region 311, and a high electric field is induced in the extended depletion layer region. The high electric field causes avalanche multiplication in the depletion layer region extended into a part of the first semiconductor region 311, and a current based on the multiplied charges is output as a signal charge. The light incident on the photoelectric conversion apparatus 100 is photoelectrically converted to cause avalanche multiplication in the depletion layer region (avalanche multiplication region), and generated charges of the first conductivity type are collected to the first semiconductor region 311.

In FIG. 6, the third and fifth semiconductor regions 313 and 315 have similar size. However, the sizes of the semiconductor regions are not limited thereto. For example, the fifth semiconductor region 315 may be greater than the third semiconductor region 313 to collect charges to the first semiconductor region 311 from a wider area.

The third semiconductor region 313 may be a P-type semiconductor region instead of a N-type. In such a case, the impurity concentration of the third semiconductor region 313 is set to be lower than that of the second semiconductor region 312. The reason is that if the impurity concentration of the third semiconductor region 313 is too high, an avalanche multiplication region can be formed between the third semiconductor region 313 and the first semiconductor region 311 to increase a dark count rate (DCR).

A patterned structure 325 made of trenches is formed in the surface of the semiconductor layer 301 on the light incident surface side. The patterned structure 325 is surrounded by the P-type fourth semiconductor region 314, and scatters the light incident on the photoelectric conversion element 102. The incident light travels obliquely in the photoelectric conversion element 102, so that an optical path length greater than or equal to the thickness of the semiconductor layer 301 can be provided. This enables photoelectric conversion of light of longer wavelengths than that without the patterned structure 325. The patterned structure 325 also prevents reflection of the incident light inside the sensor substrate 11, so that the effect of improving the photoelectric conversion efficiency of the incident light is provided. Combined with extended anode wiring that is one of the features of the present embodiment, the patterned structure 325 can further improve near infrared sensitivity because the anode wiring can efficiently reflect light obliquely diffracted by the patterned structure 325.

The fifth semiconductor region 315 and the patterned structure 325 are located to overlap in a plan view. The area of the portion of the fifth semiconductor region 315 overlapping the patterned structure 325 in a plan view is greater than that of the portion of the fifth semiconductor region 315 not overlapping the patterned structure 325. A charge occurring at a position far from the avalanche multiplication region formed between the first and fifth semiconductor regions 311 and 315 takes a long traveling time to reach the avalanche multiplication region compared to a charge occurring at a position near the avalanche multiplication region. This may increase timing jitter. Locating the fifth semiconductor region 315 and the patterned structure 325 to overlap in a plan view enables increase in the electric field in deep parts of the photodiode, and reduce the collection time of charges occurring at positions far from the avalanche multiplication region. The timing jitter can thereby be reduced.

The fourth semiconductor region 314 three-dimensionally covers the patterned structure 325, so that the occurrence of thermally excited charges at the interface of the patterned structure 325 can be reduced or prevented. This can reduce or prevent the DCR of the photoelectric conversion element 102.

The pixels 101 are isolated by trenched pixel isolation portions 324. The P-type seventh semiconductor regions 317 located around the pixel isolation portions 324 isolate the adjoining photoelectric conversion elements 102 from each other with a potential barrier. Since the photoelectric conversion elements 102 are also isolated by the potential of the seventh semiconductor regions 317, trenched pixel isolation portions such as the pixel isolation portions 324 are not necessarily indispensable. The trenched pixel isolation portions 324, if provided, are not limited to the configuration in FIG. 6 in depth or position. The pixel isolation portions 324 may be deep trench isolation (DTI) running through the semiconductor layer 301 or DTI not running through the semiconductor layer 301. Metal may be embedded in the DTI to improve light shielding performance. The pixel isolation portions 324 may be formed of SiO, a fixed charge film, a metal member, a Poly-Si, or a combination of two or more of these. The pixel isolation portions 324 may be configured to surround the entire peripheries of the photoelectric conversion elements 102 in a plan view. The pixel isolation portions 324 may be located only at the opposite sides of the photoelectric conversion elements 102. A voltage may be applied to the embedded members to induce charges at the trench interfaces for reduced DCR.

The distance from one pixel isolation portion 324 to the pixel isolation portion 324 of an adjoining pixel 101 or a pixel 101 located at the nearest position can be regarded as the size of one photoelectric conversion element 102. With the size of one photoelectric conversion element 102 as L, a distance d from the light incident surface to the avalanche multiplication region satisfies $L \times \sqrt{2}/4 < d < L \times \sqrt{2}$. If the size and depth of the photoelectric conversion element 102 satisfy the equation, the strength of the electric field in the depth direction and the strength of the electric field in planar directions near the first semiconductor region 311 are at similar levels. This reduces variations in the time taken to collect charges, and can thus improve timing jitter.

A pinning film 321, a planarization film 322, and microlenses 323 are further formed on the light incident surface side of the semiconductor layer 301. A not-illustrated filter layer may be further disposed on the light incident surface side. Various optical filters, such as a color filter, an infrared cutoff filter, and a monochrome filter, can be used for the filter layer. Examples of the color filter may include a red-green-blue (RGB) filter and a red-green-blue-white (RGBW) filter.

A wiring structure including a conductor and an insulating film is disposed on the surface of the semiconductor layer 301 opposite the light incident surface. The photoelectric conversion elements 102 illustrated in FIG. 6 each include an oxide film 341 and a protective film 342 disposed in order from near the semiconductor layer 301. Wiring layers formed of a conductor are further stacked thereon. An interlayer film 343 that is an insulating film is disposed between the wiring and the semiconductor layer 301 and between the wiring layers.

The oxide film 341 is formed of silicon oxide (SiO), for example. SiON may be used.

The protective film 342 is used for protecting the APDs 201 from plasma damage and metal contamination during etching. A nitride film of silicon nitride (SiN) is typically used, whereas a silicon oxynitride film (SiON), a silicon carbide film (SiC), or a silicon carbonitride film (SiCN) may be used. If both the oxide film 341 and the protective film 342 contain nitrogen, one having the higher nitrogen content is regarded as the protective film 342.

In the present embodiment, silicon nitride refers to a compound of nitrogen (N) and silicon (Si), where two elements having the highest composition ratios among the constituent elements of the compound except for light elements are nitrogen (N) and silicon (Si). Silicon nitride can contain light elements such as hydrogen (H) and helium (He), the amounts (at. %) of which may be greater than or less than those of nitrogen (N) and silicon (Si). Silicon nitride can contain elements other than nitrogen (N), silicon (Si), or the light elements, with concentrations lower than those of nitrogen (N) and silicon (Si). Typical elements that can be contained in silicon nitride include boron (B), carbon (C), oxygen (O), fluorine (F), phosphorus (P), chlorine (Cl), and argon (Ar). If the third richest among the constituent elements of silicon nitride except for the light elements is oxygen, this silicon nitride can be referred to as silicon oxynitride or oxygen-containing silicon nitride.

Similarly, silicon oxide is a compound of oxygen (O) and silicon (Si), where two elements having the highest composition ratios among the constituent elements of the compound except for the light elements are oxygen (O) and silicon (Si). Typical elements that can be contained in silicon oxide include hydrogen (H), helium (He), boron (B), carbon (C), nitrogen (N), fluorine (F), phosphorus (P), chlorine (Cl), and argon (Ar). If the third richest among the constituent elements of silicon oxide other than the light elements is nitrogen, this silicon oxide can be referred to as silicon nitride oxide or nitrogen-containing silicon oxide. The elements contained in the components of the photoelectric conversion apparatus 100 can be analyzed by energy dispersive X-ray spectrometry (EDX). The hydrogen content can be analyzed by elastic recoil detection analysis (ERDA).

Cathode wiring 331A is connected to the first semiconductor regions 311. Anode wiring 331B supplies a voltage to the seventh semiconductor regions 317 via the ninth semiconductor regions 319 that are anode contacts. In the present embodiment, the cathode wiring 331A and the anode wiring 331B are disposed in the same wiring layer. The cathode wiring 331A and the anode wiring 331B are formed of a conductor containing a metal such as Cu and Al. In this cross section, an outer periphery of a trace of the cathode wiring 331A is denoted as 332A. An inner periphery of the anode wiring 331B opposed to the outer periphery 332A is denoted as 332B. A dotted line 332C is an imaginary line internally dividing the gap between the outer periphery 332A of the trace of the cathode wiring 331A and the inner periphery 332B of the anode wiring 331B at equal distances. To improve the effect of reducing a change in the breakdown voltage over time, the distance between the semiconductor layer 301 and the anode wiring 331B in the depth direction is desirably small. Specifically, the wiring layer including the anode wiring 331B is a layer located as close to the semiconductor layer 301 as possible, desirably the closest, among the plurality of wiring layers stacked on the semiconductor layer 301.

The wiring layer including the anode wiring 331B is located farther from the second surface of the semiconductor layer 301 than are the contacts connecting the cathode wiring 331A to the first semiconductor regions 311.

Figure 7A:
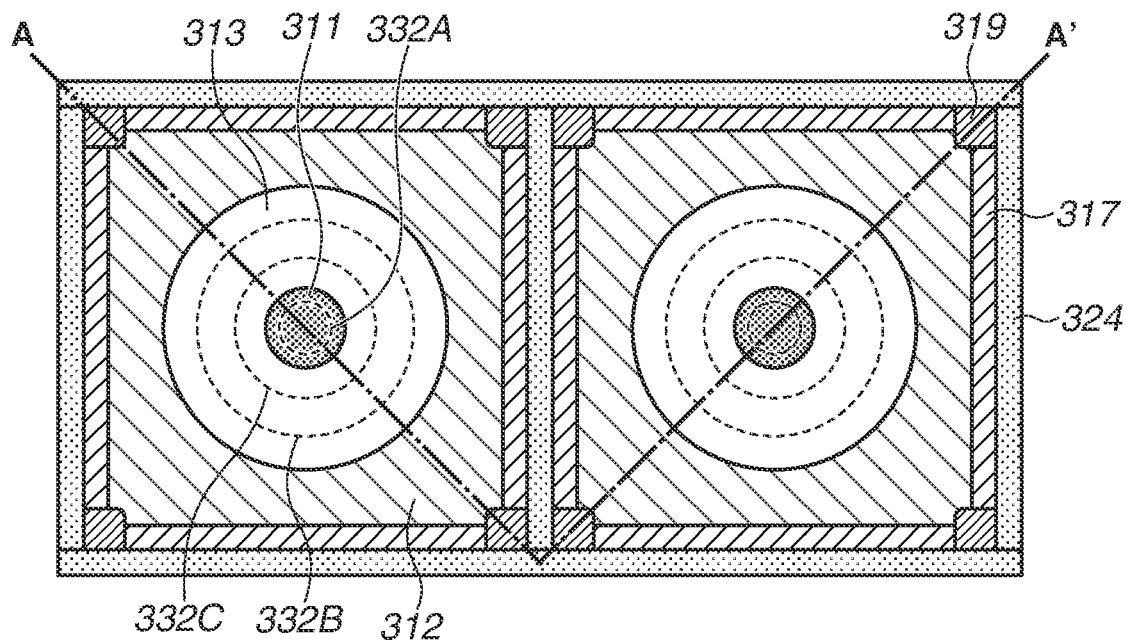
FIGS. 7A and 7B are plan views of the photoelectric conversion elements according to the first embodiment.
Figure 7B:
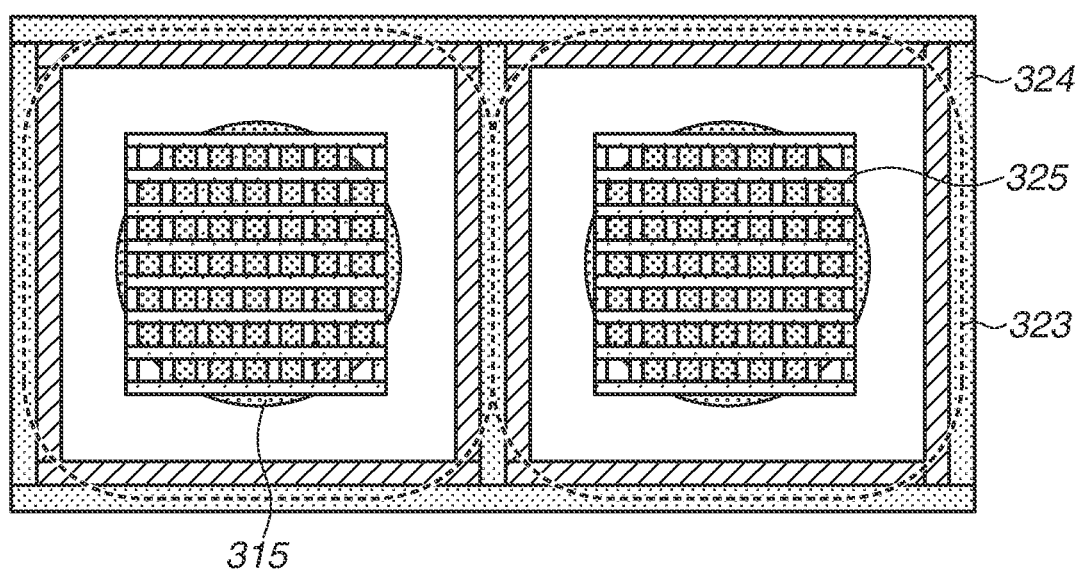

FIGS. 7A and 7B are plan views of two pixels 101 of the photoelectric conversion apparatus 100 according to the first embodiment. FIG. 7A is a plan view from the surface opposite the light incident surface. FIG. 7B is a plan view from the light incident surface side.

In FIG. 7A and FIG. 7B, the first, third, and fifth semiconductor regions 311, 313, and 315 are circular in shape and concentrically disposed. Such a structure provides the effect of reducing the DCR by reducing the local concentration of the electric field at the ends of the high field area between the first and second semiconductor regions 311 and 312. The semiconductor regions 311, 313, and 315 are not limited to the circular shapes, and may have polygonal shapes with the same barycentric positions, for example.

The dotted lines on the first and third semiconductor regions 311 and 313 indicate the respective ranges where the cathode wiring 331A and the anode wiring 331B are disposed in a plan view. Each trace of the cathode wiring 331A has a circular shape in a plan view, and its outer periphery 332A overlaps a first semiconductor region 311 in a plan view. The anode wiring 331B is a surface having holes with circular inner peripheries 332B. Each inner periphery 332B overlaps a third semiconductor region 313 in a plan view. In other words, the border between the insulating film (interlayer film) 343 opposed to a trace of the cathode wiring 331A and the anode wiring 331B overlaps the third semiconductor region 313. Here, the imaginary line 332C equally dividing the gap between the outer periphery 332A of the trace of the cathode wiring 331A and the inner periphery 332B of the anode wiring 331B overlaps the third semiconductor region 313 and not the first semiconductor region 311. Disposing the anode wiring 331B in such a configuration enables prevention of the trapping of hot electrons by the effect of Coulomb repulsive force from the anode wiring 331B.

The first and second semiconductor regions 311 and 312 form an avalanche multiplication region therebetween in the depth direction, and a field relaxation region is disposed to surround the avalanche multiplication region. Here, the field relaxation region does not need to cover the entire periphery of the avalanche multiplication region and may cover a part of the periphery of the avalanche multiplication region. The border between the insulating film opposed to the trace of the cathode wiring 331A and the anode wiring 331B overlaps the field relaxation region in a plan view. In other words, the imaginary line 332C equally dividing the gap between the outer periphery 332A of the trace of the cathode wiring 331A and the inner periphery 332B of the anode wiring 331B can be said to overlap the field relaxation region.

In FIG. 7B, the patterned structures 325 are formed in a grid shape in a plan view. The patterned structures 325 are located to overlap the first and fifth semiconductor regions 311 and 315. The barycentric positions of the patterned structures 325 fall within the avalanche multiplication regions in a plan view. In such grid-shaped trench structures as illustrated in FIG. 7B, the intersections of the trenches have a greater trench depth than that of the singly-extending portions of the trenches. The trench bottoms at the intersections of the trenches are located closer to the light incident surface than one half of the thickness of the semiconductor layer 301. Herein, the trench depth refers to the depth from the first surface to the bottom, and can be said to be the depth of the recesses of the patterned structures 325.

Figure 8:
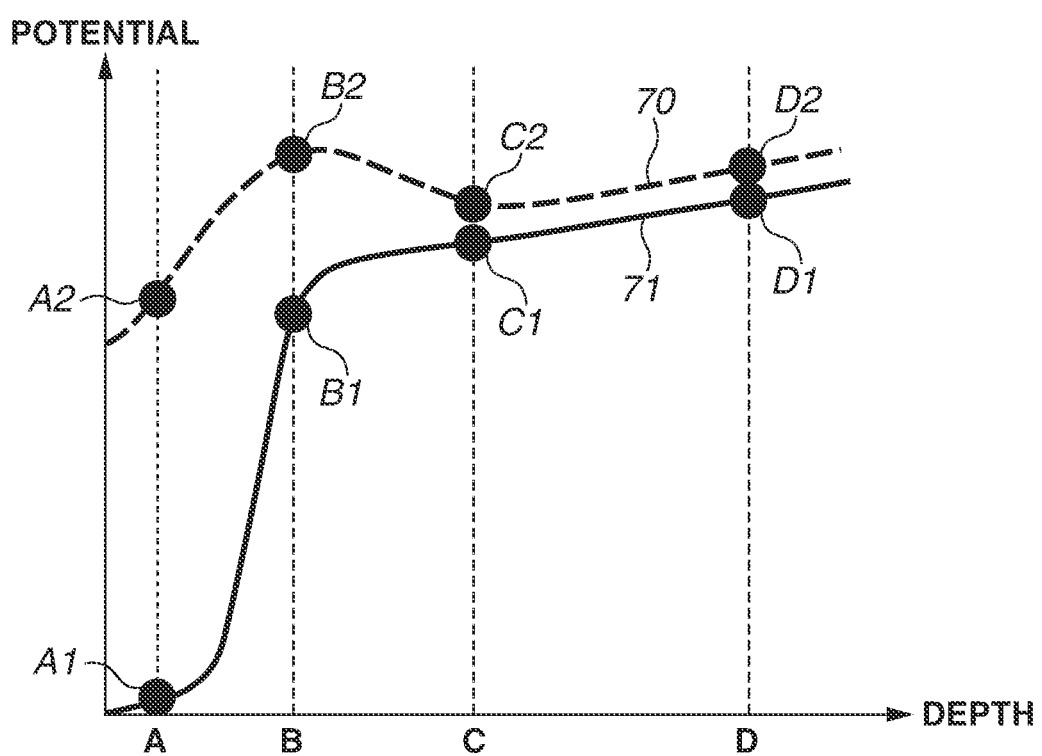
FIG. 8 is a potential map of a photoelectric conversion element according to the first embodiment.

FIG. 8 is a potential map of a photoelectric conversion element 102 illustrated in FIG. 6.

A dotted line 70 in FIG. 8 indicates the potential distribution along the segment FF' in FIG. 6. A solid line 71 in FIG. 8 indicates the potential distribution along the segment EE' in FIG. 6. FIG. 8 illustrates potentials with respect to an electron that is the majority carrier charge in N-type semiconductor regions. If the majority carrier charge is a hole, the relationship between the higher and lower potentials is reversed. Depth A in FIG. 8 corresponds to height A in FIG. 6. Similarly, depths B, C, and D correspond to heights B, C, and D, respectively.

In FIG. 8, the potential level of the solid line 71 at depth A will be denoted by A1, the potential level of the dotted line 70 at depth A by A2, the potential level of the solid line 71 at depth B by B1, and the potential level of the dotted line 70 at depth B by B2. The potential level of the solid line 71 at depth C will be denoted by C1, the potential level of the dotted line 70 at depth C by C2, the potential level of the solid line 71 at depth D by D1, and the potential level of the dotted line 70 at depth D by D2.

From FIGS. 6 and 8, it can be seen that the potential level of the first semiconductor region 311 corresponds to A1. The potential level near the center of the second semiconductor region 312 corresponds to B1. The potential level of the third semiconductor region 313 corresponds to A2. The potential level at the outer edge of the second semiconductor region 312 corresponds to B2.

The dotted line 70 in FIG. 8 decreases gradually in potential from depth D to depth C. The potential then increases gradually from depth C to depth B, and reaches the potential level B2 at depth B. The potential falls from depth B to depth A, and reaches the potential level A2 at depth A.

Meanwhile, the solid line 71 decreases gradually in potential from depth D to depth C and from depth C to depth B, and reaches the potential level B1 at depth B. The potential then drops sharply from depth B to depth A, and reaches the potential level A1 at depth A. At depth D, the potentials of the dotted line 70 and the solid line 71 are at similar levels. In the areas indicated by the segments EE' and FF, the potentials have a gently falling gradient toward the second surface side of the semiconductor layer 301. Charges occurring in the photoelectric conversion element 102 thus move down the gentle potential gradient toward the second surface.

In the APD 201 according to the present embodiment, the P-type second semiconductor region 312 has a lower impurity concentration than that of the N-type first semiconductor region 311. Moreover, the first and second semiconductor regions 311 and 312 are supplied with respective reverse biasing potentials. This forms a depletion layer region in the second semiconductor region 312. With such a structure, the second semiconductor region 312 serves as a potential barrier against charges photoelectrically converted in the fifth semiconductor region 315, facilitating charge collection to the first semiconductor region 311.

In FIG. 6, the second semiconductor region 312 is disposed throughout the photoelectric conversion element 102. However, instead of the second semiconductor region 312 that is a P-type semiconductor region, a N-type semiconductor region may be disposed in the portion overlapping the first semiconductor region 311 in a plan view. The impurity concentration of this N-type semiconductor region is set to be lower than that of the first semiconductor region 311. In the case of using the N-type semiconductor region, the second semiconductor region 312 may be excluded in the portion overlapping the first semiconductor region 311 in a plan view. The disposed second semiconductor region 312 can be regarded as one with a slit formed. In such a case, a potential difference between the second semiconductor region 312 and the slit portion causes the potential at depth C in FIG. 6 to decrease from the segment FF to the segment EE'. This facilitates the movement of charges toward the first semiconductor region 311 in the process where the charges photoelectrically converted in the fifth semiconductor region 315 move. On the other hand, if the second semiconductor region 312 is disposed throughout the photoelectric conversion element 102 as in FIG. 6, the voltage to be applied to obtain a high electric field for avalanche multiplication can be lowered to reduce noise due to the formation of a locally high field region as compared to the case where the slit is formed.

The charges moved to near the second semiconductor region 312 are accelerated for avalanche multiplication by the steep potential gradient of the solid line 71 in FIG. 8 from depth B to depth A, i.e., by a high electric field.

By contrast, the potential distribution between the N-type fifth semiconductor region 315 and the P-type second semiconductor region 312 in FIG. 6, i.e., the dotted line 70 in FIG. 8 from depth C to depth B does not cause avalanche multiplication. The charges occurring in the fifth semiconductor region 315 can thus be counted as signal charges without increasing the area of the high field region (avalanche multiplication region) with respect to the size of the APD 201. Note that while the conductivity type of the fifth semiconductor region 315 has been described to be N type, the fifth semiconductor region 315 may be a P-type semiconductor region as long as its impurity concentration satisfies the foregoing potential relationship.

Charges photoelectrically converted in the second semiconductor region 312 flow into the fifth semiconductor region 315 due to the potential gradient of the dotted line 70 in FIG. 8 from depth B to depth C. For the reason described above, the charges in the fourth semiconductor region 314 move easily to the second semiconductor region 312. The charges photoelectrically converted in the second semiconductor region 312 thus move to the first semiconductor region 311 and are detected as a signal charge through avalanche multiplication. The photoelectric conversion element 102 thus has sensitivity to the charges photoelectrically converted in the second semiconductor region 312.

The dotted line 70 in FIG. 8 indicates the sectional potential along the segment FF' in FIG. 6. On the dotted line 70, A2 corresponds to the point at which height A and the segment FF' intersect in FIG. 6, B2 the point at which height B and the segment FF' intersect, C2 the point at which height C and the segment FF' intersect, and D2 the point at which height D and the segment FF intersect. Electrons photoelectrically converted in the fourth semiconductor region 314 in FIG. 6 move along the potential gradient from D2 to C2 in FIG. 8, but are difficult to move from C2 to B2 since the potential gradient from C2 to B2 forms a potential barrier to the electrons. The electrons thus move to near the center of the fourth semiconductor region 314 indicated by the segment EE' in FIG. 6. The moved electrons move along the potential gradient from C1 to B1 in FIG. 8, avalanche-multiplied along the steep potential gradient from B1 to A1, and passed through the first semiconductor region 311 and then detected as a signal charge.

Charges occurring near the border between the fourth and sixth semiconductor regions 314 and 316 in FIG. 6 move along the potential gradient from D2 to C2 in FIG. 8. As described above, the charges then move to near the center of the fifth semiconductor region 315 indicated by the segment EE' in FIG. 6. The charges are then avalanche-multiplied along the steep potential gradient from B1 to A1. The avalanche-multiplied charges are passed through the first semiconductor region 311 and then detected as a signal charge.

Now, since a high electric field is applied to near the first semiconductor regions 311, hot carriers occur due to imbalance in the thermal state of the sensor substrate 11 and the carriers. The hot carriers are trapped in trap sites in the vicinities of the cathode regions near the wiring layers. Since the trapped hot carriers increase over time, the potentials near the cathode regions and the electric field intensity in the high field regions also change over time, and the breakdown voltage can vary over time.

Figure 9A:
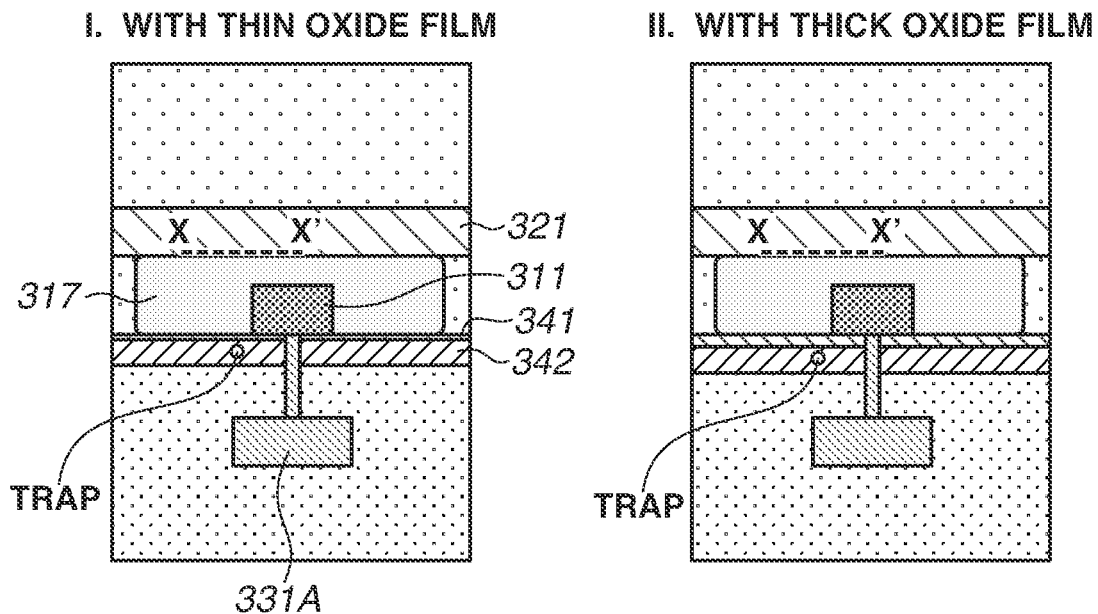
FIGS. 9A and 9B illustrate comparative examples of a photoelectric conversion element according to the first embodiment.
Figure 9B:
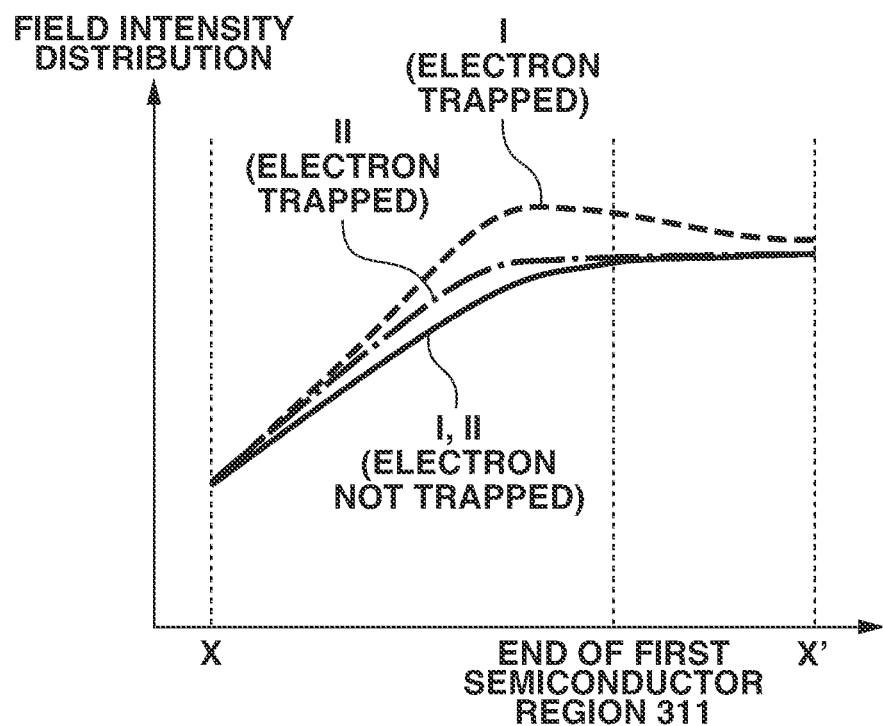

The issue to be solved by the embodiments and the effects of the present embodiment will be described with reference to schematic sectional views of a photoelectric conversion element 102 illustrated in FIG. 9A, the schematic diagram in FIG. 9B illustrating a field intensity distribution, and an enlarged sectional view of the oxide film 341 and the protective film 342 illustrated in FIG. 10. FIG. 9A (I) is a schematic diagram illustrating a cross section of a pixel 101 with a thin oxide film 341, and FIG. 9A (II) a schematic diagram illustrating a cross section of a pixel 101 with a thick oxide film 341. As can be seen from FIG. 9B, in the case in FIG. 9A (I) where the oxide film 341 in an interval X-X' is thin, electrons (hot carriers) trapped in the protective film 342 cause field concentration near the ends and directly above the center of the first semiconductor region 311. Since the breakdown voltage is roughly inversely proportional to the maximum field intensity, the breakdown voltage changes if the electric field concentrates directly above the center of the high-electric-field first semiconductor region 311. The breakdown voltage is less likely to change before and after the trapping of hot carriers if the oxide film 341 is thick and a change in the maximum field intensity is small as illustrated in FIG. 9A (II).

A relationship between the thickness of the oxide film 341 and the likelihood of hot carrier trapping and field concentration will be described. Take the case of hot carriers trapped in trap sites of the protective film 342. As illustrated in FIG. 10, a combined capacitance $C_{all}$ of a trap site is given by the following Eq. 1:

$$C_{all} = \frac{1}{1/C_{sio} + 1/C_{prot}} \qquad 1$$

where $C_{sio}$ is the capacitance of the oxide film 341, and $C_{prot}$ is the capacitance of the protective film 342.

The thickness of the oxide film 341 will be denoted by $d_{sio}$, the thickness of the protective film 342 by $d_{prot}$ ($d_{sin}$), the relative permittivity of the oxide film 341 by $\varepsilon_{sio}$, the relative permittivity of the protective film 342 by $\varepsilon_{prot}$ ($\varepsilon_{sin}$), and the depth from the surface of the protective film 342 to the trap site by $d_{trap}$. The capacitances $C_{sio}$ and $C_{prot}$ are expressed by the following Exp. 2 and Exp. 3, respectively:

$$C_{sio} \propto \varepsilon_{sio}/d_{sio} \qquad 2$$

$$C_{prot} \propto \varepsilon_{sin}/d_{trap} \qquad 3$$

The effect of a hot carrier trapped in a trap site on the potential at the surface of the semiconductor layer 301 is proportional to the combined capacitance $C_{all}$. To reduce a change in the breakdown potential over time, it is therefore important to reduce the combined capacitance $C_{all}$. As expressed by Eq. 1, the combined capacitance $C_{all}$ is a series capacitance of two capacitors. The value of the series capacitance is strongly dominated by the smaller of the capacitances of the two capacitors. In other words, to reduce the capacitance $C_{all}$, the oxide film 341 is desirably increased in thickness to satisfy a condition for the capacitance $C_{sio}$ of the oxide film 341 to be dominant over the capacitance $C_{prot}$ of the protective film 342 ($C_{prot} > C_{sio}$), so that Exp. 4 to be described below is satisfied. If the oxide film 341 is formed of SiO, the relative permittivity $\varepsilon_{sio}$ is approximately 3.6 to 4.0. If the protective film 342 is formed of SiN, the relative permittivity $\varepsilon_{sin}$ is approximately 7.0 to 9.0. The following Exp. 4 is approximated by assuming the relative permittivity $\varepsilon_{sio}$ of the oxide film 341 to be 3.8 and the relative permittivity $\varepsilon_{sin}$ of the protective film 342 to be 8.0:

$$d_{sio} > d_{trap}\varepsilon_{sio}/\varepsilon_{sin} \approx 0.475 \times d_{trap} \qquad 4$$

If trap sites are uniformly distributed within the protective film 342, a representative trap site depth $d_{trap}$ can be assumed to be $d_{sin}/2$. In other words, the foregoing capacitance relationship can be set to be satisfied at more than 50% of all trap sites in the protective film 342. The condition for the thickness $d_{sio}$ of the oxide film 341 to satisfy here is given by the following Exp. 5:

$$d_{sio} > d_{sin}\varepsilon_{sio}/2\varepsilon_{sin} \approx 0.238 \times d_{sin} \qquad 5$$

The foregoing capacitance relationship is more desirably satisfied at all the trap sites in the protective film 342. In such a case, $C_{prot} > C_{sio}$ is desirably satisfied under the condition that the trap site depth $d_{trap}$ at which $C_{prot}$ is the lowest is equal to $d_{sin}$. If the trap site depth $d_{trap} = d_{sin}$, the condition for the thickness $d_{sio}$ of the oxide film 341 to satisfy is given by the following Exp. 6:

$$d_{sio} > d_{sin}\varepsilon_{sio}/\varepsilon_{sin} \approx 0.475 \times d_{sin} \qquad 6$$

Suppose, for example, that the protective film 342 is a silicon nitride film, the relative permittivity $\varepsilon_{sio}$ of the oxide film 341 is 3.8, the relative permittivity $\varepsilon_{sin}$ of the protective film 342 is 8.0, and the thickness $d_{sin}$ of the protective film 342 is 60 nm. In such a case, the condition of the foregoing Exp. 5 is satisfied if the thickness $d_{sio}$ of the oxide film 341 is greater than 15 nm. The condition of the foregoing Exp. 6 is satisfied if the thickness $d_{sio}$ of the oxide film 341 is greater than 30 nm.

The foregoing description has dealt with examples where the cumulative value of the trapping probability density function is 50% and 100%. However, the two numerical values are not restrictive. For example, a cumulative value of 80% may be used. In such a case, the foregoing capacitance relationship can be satisfied at more than 80% of the trap sites in the protective film 342 if the thickness $d_{sio}$ of the oxide film 341 is greater than 24 nm.

As described above, by increasing the oxide film 341 in thickness so that the thickness of the oxide film 341 with respect to the protective film 342 satisfies a certain condition, a change in the potential at the surface of the semiconductor layer 301 due to the trapping of hot carriers in the protective film 342 can be reduced, thus preventing a change in the breakdown voltage over time.

A second embodiment will be described below. A photoelectric conversion apparatus according to a second embodiment will be described with reference to FIG. 11.

A description of parts common with the first embodiment will be omitted, and differences from the first embodiment will be described. In the present embodiment, the oxide film 341 is formed with a greater thickness near portions where hot carrier injection into the protective film 342 is more likely to occur.

Figure 11:
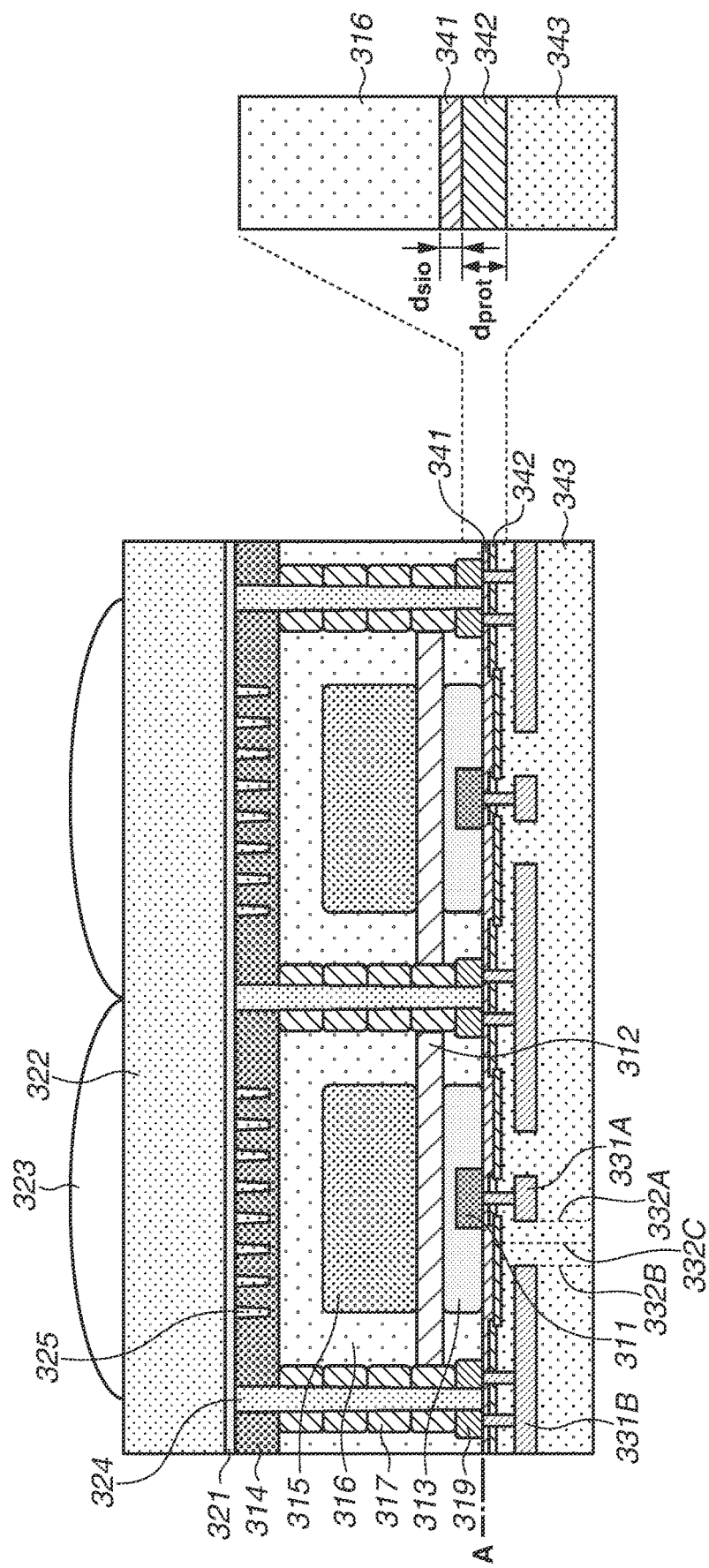
FIG. 11 is a sectional view of photoelectric conversion elements according to the second embodiment.

FIG. 11 is a sectional view of two photoelectric conversion elements 102 of the photoelectric conversion apparatus according to the second embodiment, seen in a direction perpendicular to the planar direction of the substrates.

Hot carriers are generated by carriers being accelerated by an electric field. Hot carrier injection is therefore likely to occur in regions overlapping the third semiconductor regions 313 in a plan view. In particular, hot carriers are likely to occur near the ends of the first semiconductor regions 311. In the present embodiment, the oxide film 341 is formed with a greater thickness in the regions overlapping the third semiconductor regions 313 in a plan view than in the regions not overlapping the third semiconductor regions 313. Since the thickness of the oxide film 341 in the regions connected to the cathode wiring 331A and the anode wiring 331B does not need to be increased, the oxide film 341 does not interfere with the manufacturing of contact plugs. Locally changing the thickness of the oxide film 341 thus can prevent a change in the breakdown voltage over time while ensuring manufacturing stability of the contact plugs.

A third embodiment will be described below. A photoelectric conversion apparatus according to a third embodiment will be described with reference to FIG. 12.

A description of parts common with the first or second embodiment will be omitted, and differences from the first embodiment will mainly be described.

Figure 12:
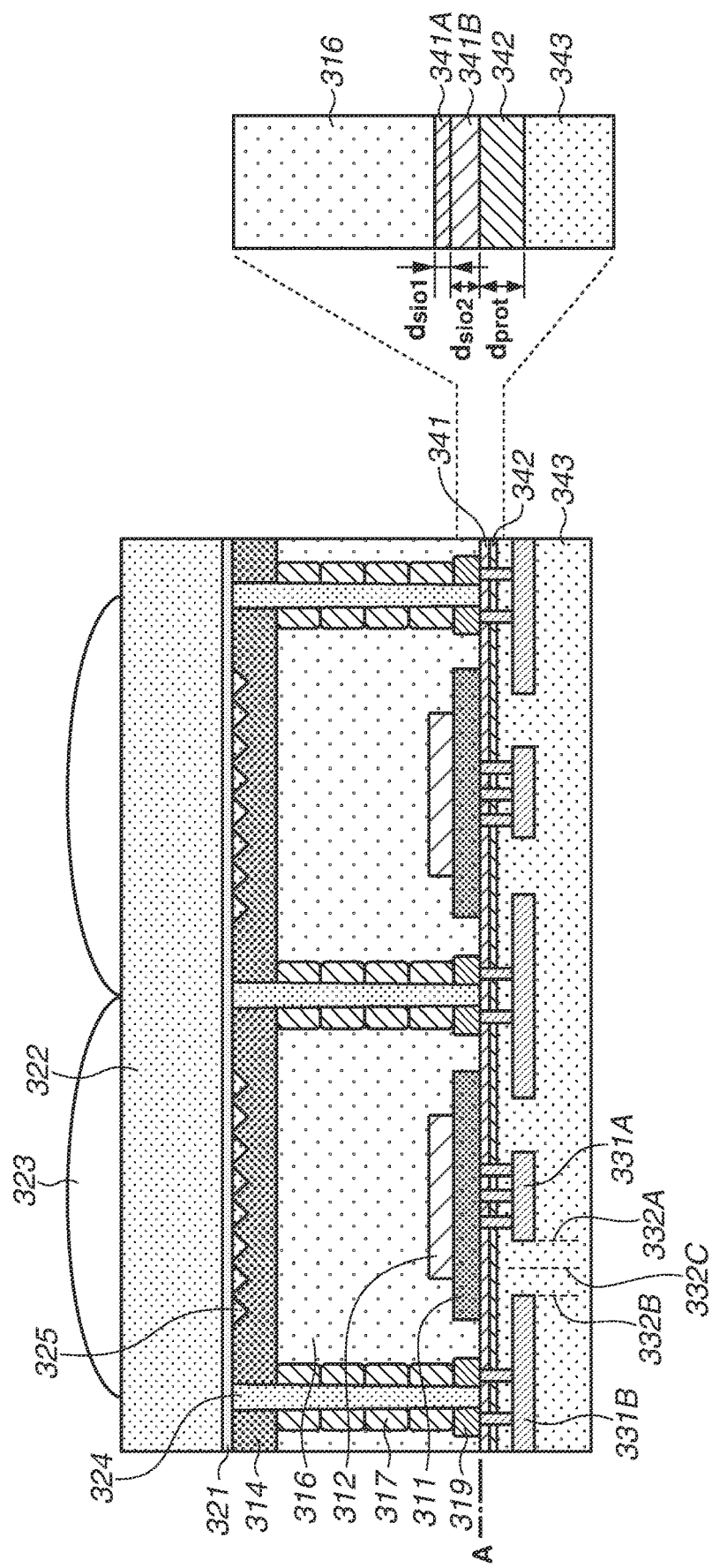
FIG. 12 is a sectional view of photoelectric conversion elements according to a third embodiment.

FIG. 12 is a sectional view of photoelectric conversion elements 102 of the photoelectric conversion apparatus according to the third embodiment, seen in a direction perpendicular to the planar direction of the semiconductor layer. FIG. 12 corresponds to a cross section taken along the line A-A' in FIG. 13A. In the photoelectric conversion apparatus according to the present embodiment, the proportion of the N-type semiconductor region 311 to the light receiving surface of each pixel is high and the area of the P-type second semiconductor region 312 with respect to the light receiving surface of the pixel is small as compared to the photoelectric conversion apparatus 100 according to the first embodiment.

The incident light is avalanche-multiplied between the first and second semiconductor regions 311 and 312. If the pixel opening is designed to expose the first and second semiconductor regions 311 and 312 to light, the opening ratio of the photoelectric conversion apparatus according to the present embodiment is lower than those of the photoelectric conversion apparatuses 100 according to the first and second embodiments. The low opening ratio can reduce the volume of photoelectric conversion areas capable of signal detection and thus reduce crosstalk.

The patterned structures 325 include trenches of rectangular prism shape, each having a triangular cross section with the light incident surface at the bottom. Such patterned structures 325 can be formed by etching along crystal faces with high manufacturing stability.

In the present embodiment, the oxide film 341 includes an oxide film 341A and an oxide film 341B in order from the semiconductor layer side. Considering impact on the DCR, the oxide film 341A is desirably a highly uniform oxide film since the oxide film 341A is in contact with the semiconductor layer. By contrast, the oxide film 341B is a layer intended to provide a sufficient thickness as the entire oxide film 341, and desirably has a high film deposition rate in view of mass productivity. The plurality of layers constituting the oxide film 341 may include a layer of an oxynitride film, for example. By forming the oxide film 341 including a plurality of layers different in at least any one of a film forming method, a physical property, and a chemical composition using a plurality of different film forming methods, a change in the breakdown voltage over time can be reduced while reducing the manufacturing time.

Figure 13A:
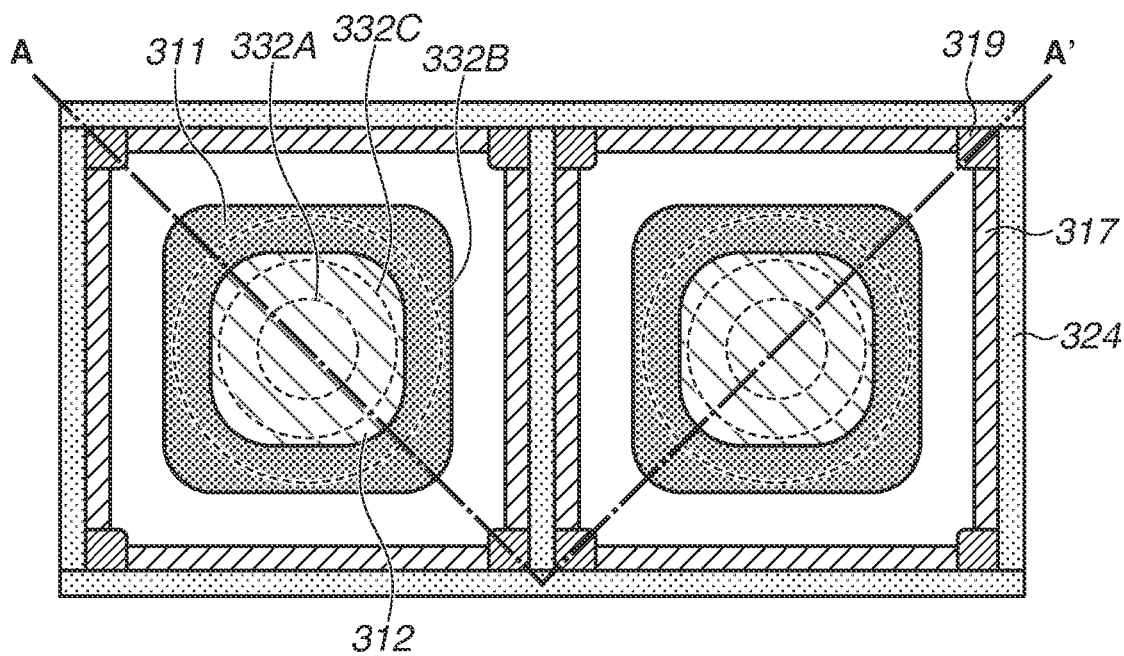
FIGS. 13A and 13B are each a plan view of photoelectric conversion elements according to the third embodiment.
Figure 13B:
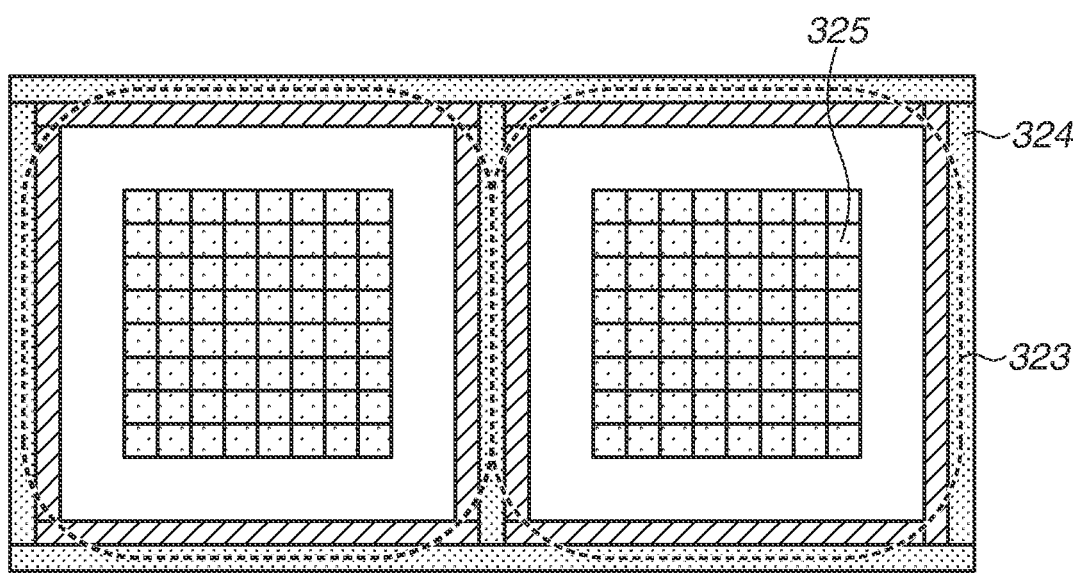

FIGS. 13A and 13B are plan views of two pixels of the photoelectric conversion apparatus according to the third embodiment. FIG. 13A is a plan view from the surface opposite the light incident surface. FIG. 13B is a plan view from the light incident surface side. In the photoelectric conversion apparatus illustrated in FIG. 13A, the portions of the first semiconductor regions 311 not overlapping the second semiconductor regions 312 in a plan view serve as field relaxation regions surrounding the avalanche multiplication regions. The entire imaginary lines 332C internally dividing the gaps between the outer peripheries 332A of the traces of cathode wiring 331A and the inner peripheries 332B of the anode wiring 331B at equal distances overlap the first semiconductor regions 311 in a plan view. The patterned structures 325 are disposed to overlap the first semiconductor regions 311.

Figure 14:
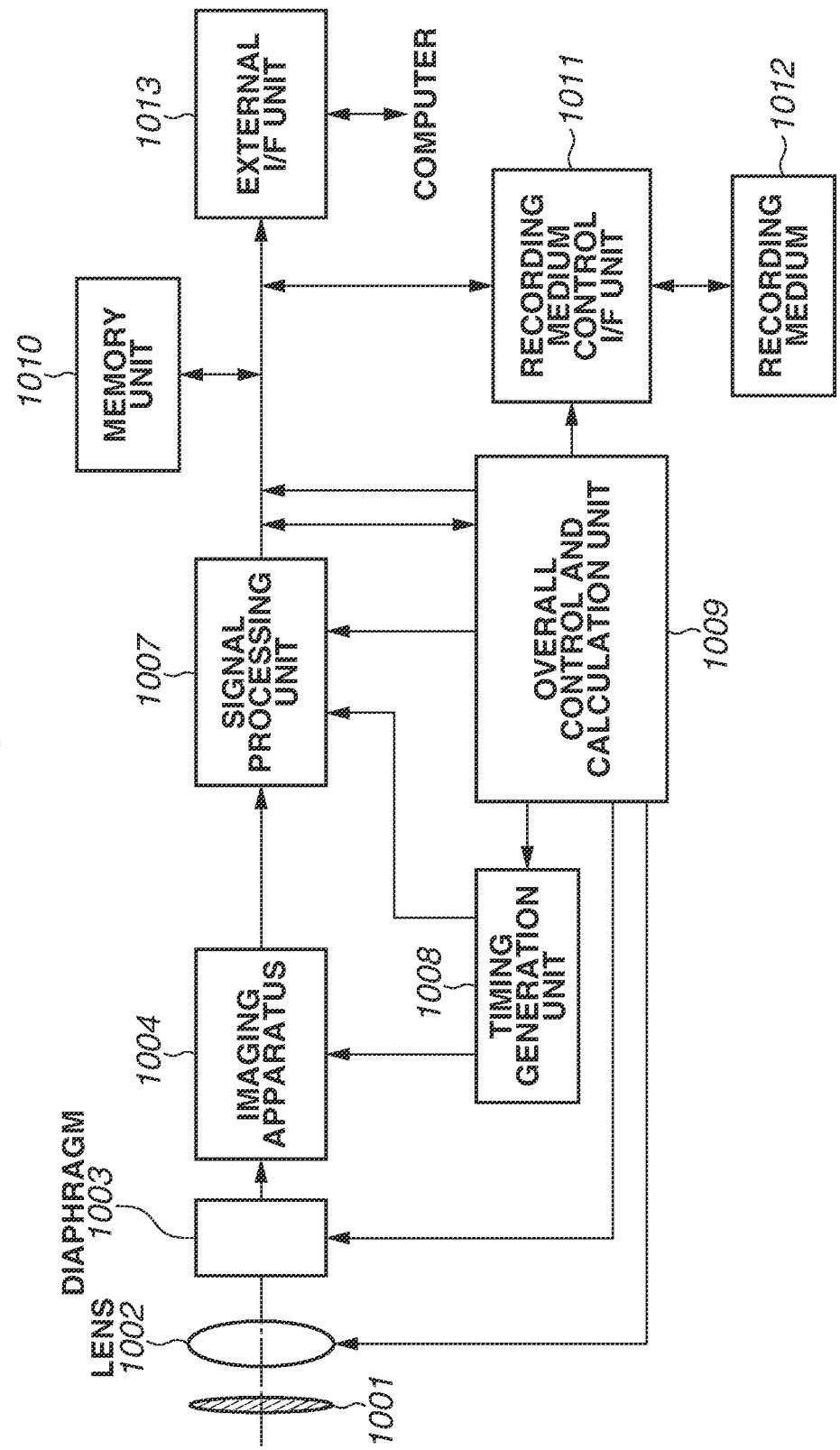
FIG. 14 is a functional block diagram of a photoelectric conversion system according to a fourth embodiment.

A fourth embodiment will be described below. A photoelectric conversion system according to a fourth embodiment will be described with reference to FIG. 14. FIG. 14 is a block diagram illustrating a schematic configuration of the photoelectric conversion system according to the present embodiment.

The photoelectric conversion apparatuses described in the foregoing first to third embodiments are applicable to various photoelectric conversion systems. Examples of the applicable photoelectric conversion systems include a digital still camera, a digital camcorder, a surveillance camera, a copying machine, a facsimile, a mobile phone, an on-vehicle camera, and an observation satellite. A camera module including an optical system, such as a lens, and an imaging apparatus is also included in the photoelectric conversion systems. As an example, FIG. 14 illustrates a block diagram of a digital still camera.

The photoelectric conversion system illustrated in FIG. 14 includes an imaging apparatus 1004 that is an example of a photoelectric conversion apparatus, and a lens 1002 for forming an optical image of an object on the imaging apparatus 1004. The photoelectric conversion system further includes a diaphragm 1003 for changing the amount of light passing through the lens 1002 to the imaging apparatus 1004, and a barrier 1001 for protecting the lens 1002. The lens 1002 and the diaphragm 1003 constitute an optical system for collecting light to the imaging apparatus 1004. The imaging apparatus 1004 is the photoelectric conversion apparatus according to any one of the foregoing embodiments, and converts the optical image formed by the lens 1002 into an electrical signal.

The photoelectric conversion system also includes a signal processing unit 1007 that is an image generation unit for generating an image by processing the output signal (electrical signal) output from the imaging apparatus 1004. The signal processing unit 1007 performs an operation for making various corrections and compressions as appropriate and outputting image data. The signal processing unit 1007 may be formed on a semiconductor substrate where the imaging apparatus 1004 is disposed, or on a semiconductor substrate different from the imaging apparatus 1004.

The photoelectric conversion system further includes a memory unit 1010 for temporarily storing the image data, and an external interface (I/F) unit 1013 for communicating with an external computer. The photoelectric conversion system further includes a recording medium 1012 for recording and reading imaging data, such as a semiconductor memory, and a recording medium control I/F unit 1011 for performing recording and reading on the recording medium 1012. The recording medium 1012 may be built in the photoelectric conversion system, or detachably attachable to the photoelectric conversion system.

The photoelectric conversion system further includes an overall control and calculation unit 1009 that controls various calculations and the entire digital still camera, and a timing generation unit 1008 that outputs various timing signals to the imaging apparatus 1004 and the signal processing unit 1007. The timing signals may be input from outside. The photoelectric conversion system desirably includes at least the imaging apparatus 1004 and the signal processing unit 1007 that processes the output signal output from the imaging apparatus 1004.

The imaging apparatus 1004 outputs an imaging signal to the signal processing unit 1007. The signal processing unit 1007 performs predetermined signal processing on the imaging signal output from the imaging apparatus 1004, and outputs image data. The signal processing unit 1007 generates an image using the imaging signal.

As described above, according to the present embodiment, a photoelectric conversion system to which the photoelectric conversion apparatus (imaging apparatus) according to any one of the foregoing embodiments is applied is implementable.

Figure 15A:
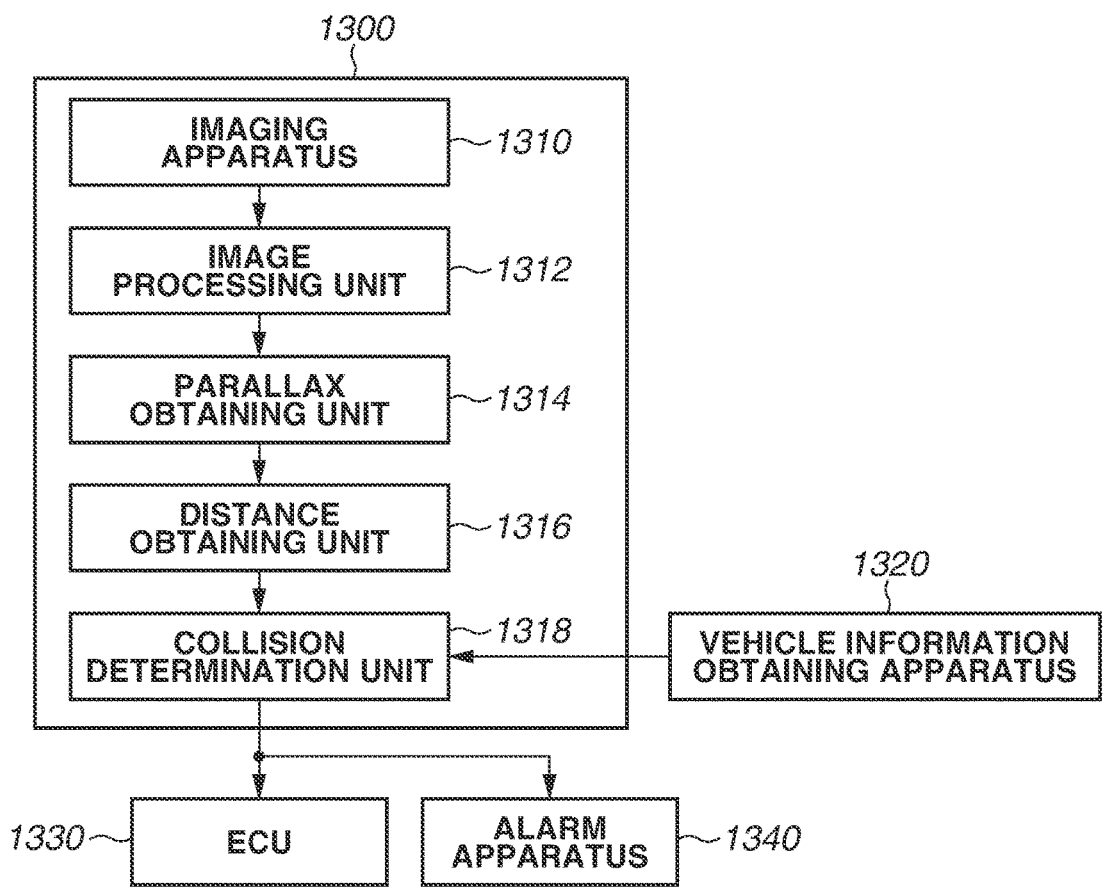
FIGS. 15A and 15B are each a functional block diagram of a photoelectric conversion system according to a fifth embodiment.
Figure 15B:
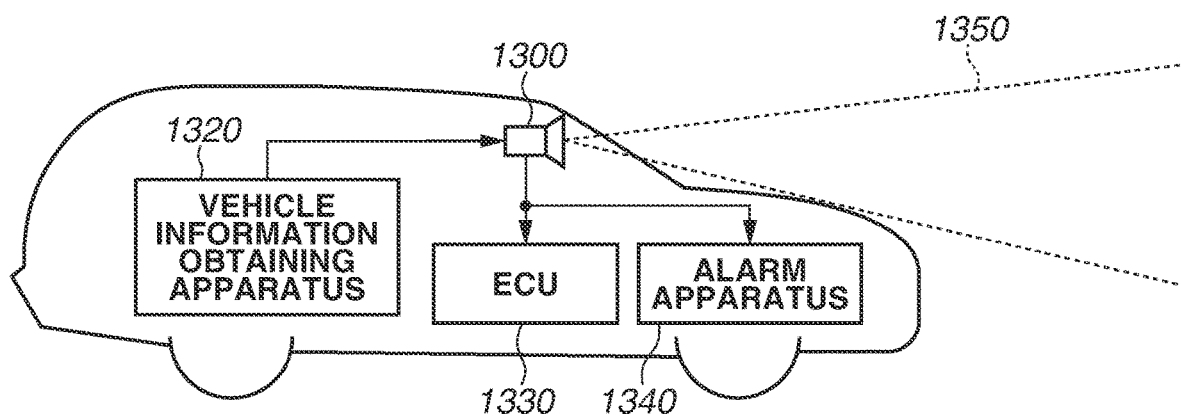

A fifth embodiment will be described below. A photoelectric conversion system and a movable body according to the fifth embodiment will be described with reference to FIGS. 15A and 15B. FIGS. 15A and 15B are diagrams illustrating a configuration of the photoelectric conversion system and the movable body according to the present embodiment.

FIG. 15A illustrates an example of a photoelectric conversion system related to an on-vehicle camera. A photoelectric conversion system 1300 includes an imaging apparatus 1310. The imaging apparatus 1310 is the photoelectric conversion apparatus described in any one of the foregoing embodiments. The photoelectric conversion system 1300 includes an image processing unit 1312 that performs image processing on a plurality of pieces of image data obtained by the imaging apparatus 1310, and a parallax obtaining unit 1314 that calculates a parallax (phase difference between parallax images) from a plurality of pieces of image data obtained by the photoelectric conversion system 1300. The photoelectric conversion system 1300 also includes a distance obtaining unit 1316 that calculates a distance to a target object based on the calculated parallax, and a collision determination unit 1318 that determines whether there is a possibility of collision based on the calculated distance. Here, the parallax obtaining unit 1314 and the distance obtaining unit 1316 are examples of a distance information obtaining unit that obtains distance information about the target object. In other words, distance information refers to information about a parallax, a defocus amount, the distance to the target object, etc. The collision determination unit 1318 may determine the possibility of collision based on any one of the pieces of distance information. The distance information obtaining unit may be implemented by dedicatedly designed hardware or by a software module.

Alternatively, the distance information obtaining unit may be implemented using a field programmable gate array (FPGA) or an application specific integrated circuit (ASIC). The distance information obtaining unit may be implemented by a combination of these.

The photoelectric conversion system 1300 is connected to a vehicle information obtaining apparatus 1320, and can obtain vehicle information such as a vehicle speed, yaw rate, and steering angle. The photoelectric conversion system 1300 is also connected to an electronic control unit (ECU) 1330 that is a control unit for outputting a control signal for causing the vehicle to produce braking force based on the result of the determination made by the collision determination unit 1318. The photoelectric conversion system 1300 is also connected to an alarm apparatus 1340 that issues an alarm to the driver based on the result of the determination made by the collision determination unit 1318. For example, if the result of the determination made by the collision determination unit 1318 shows a high possibility of collision, the ECU 1330 performs vehicle control to avoid collision or reduce damage by putting the brakes on, easing the gas pedal, and/or reducing engine output. The alarm apparatus 1340 warns the user by issuing an alarm sound, displaying alarm information on a screen of a car navigation system, and/or vibrating the seat belt or the steering wheel.

In the present embodiment, the photoelectric conversion system 1300 captures images around the vehicle, e.g., in front of or behind the vehicle. FIG. 15B illustrates the photoelectric conversion system in the case of capturing images in front of the vehicle (imaging range 1350). The vehicle information obtaining apparatus 1320 transmits instructions to the photoelectric conversion system 1300 or the imaging apparatus 1310. With such a configuration, the accuracy of distance measurement can be further improved.

While the foregoing photoelectric conversion system is described to perform control for avoiding collision with another vehicle, the photoelectric conversion system is also applicable to automatic driving control for following another vehicle or automatic driving control for staying in the lane. Moreover, the photoelectric conversion system is not limited to a vehicle such as an automobile, and is applicable to movable bodies (movable apparatuses), such as a ship, aircraft, and industrial robot. The photoelectric conversion system is not limited to a movable body, either, and is widely applicable to equipment using object recognition, such as an intelligent transport system (ITS).

Figure 16:
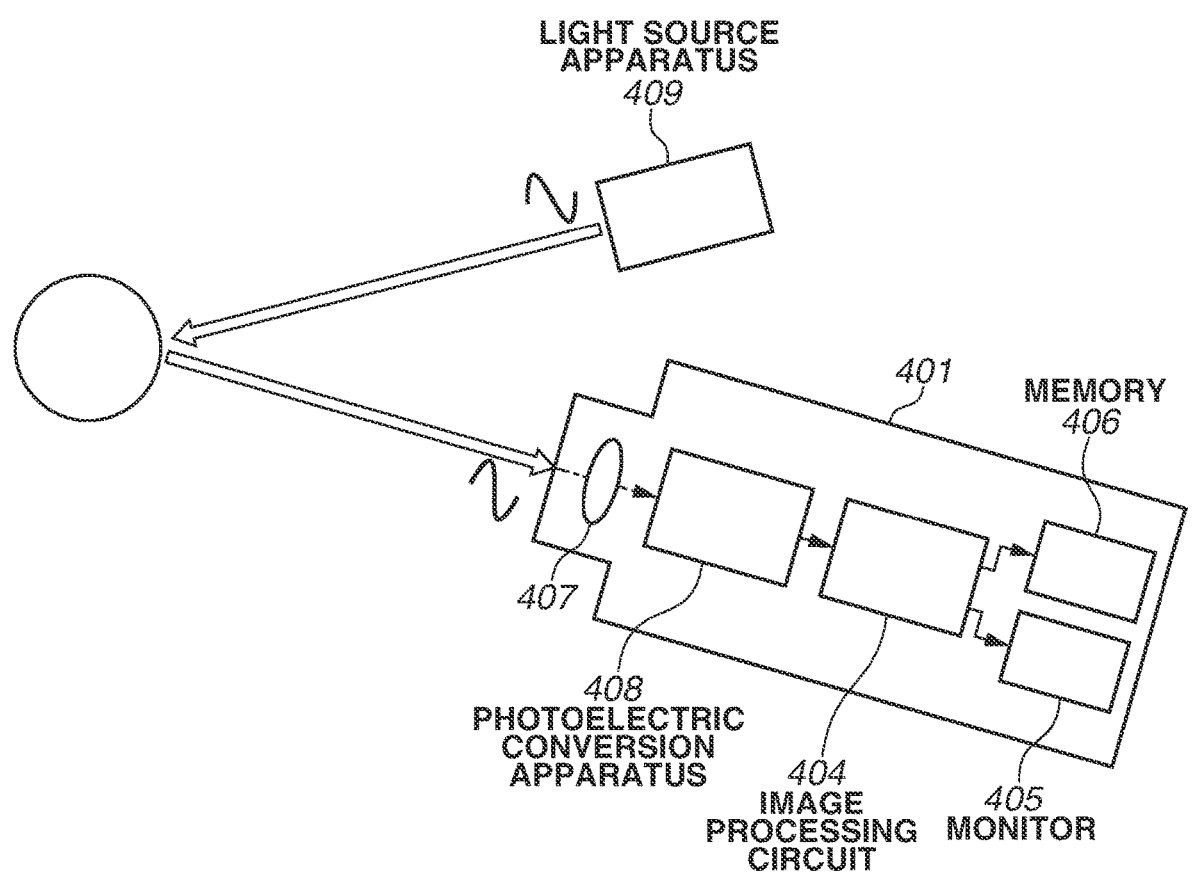
FIG. 16 is a functional block diagram of a photoelectric conversion system according to a sixth embodiment.

A sixth embodiment will be described below. A photoelectric conversion system according to the sixth embodiment will be described with reference to FIG. 16. FIG. 16 is a block diagram illustrating a configuration example of a distance image sensor that is the photoelectric conversion system according to the present embodiment.

As illustrated in FIG. 16, a distance image sensor 401 includes an optical system 407, a photoelectric conversion apparatus 408, an image processing circuit 404, a monitor 405, and a memory 406. The distance image sensor 401 can obtain a distance image based on a distance to an object by receiving light (modulated light or pulsed light) that is projected from a light source apparatus 409 upon the object and reflected at the surface of the object.

The optical system 407 includes one or a plurality of lenses. The optical system 407 guides the image light (incident light) from the object to the photoelectric conversion apparatus 408 and forms an image on the light receiving surface (sensor unit) of the photoelectric conversion apparatus 408.

Any one of the photoelectric conversion apparatuses according to the foregoing embodiments is applied to the photoelectric conversion apparatus 408. A distance signal indicating a distance determined from a light reception signal output from the photoelectric conversion apparatus 408 is supplied to the image processing circuit 404.

The image processing circuit 404 performs image processing for constructing a distance image based on the distance signal supplied from the photoelectric conversion apparatus 408. The distance image (image data) obtained by the image processing is supplied to and displayed on the monitor 405, or supplied to and stored (recorded) in the memory 406.

The distance image sensor 401 configured thus can obtain, for example, a more accurate distance image because of improvement in pixel characteristics by the application of the foregoing photoelectric conversion apparatus.

Figure 17:
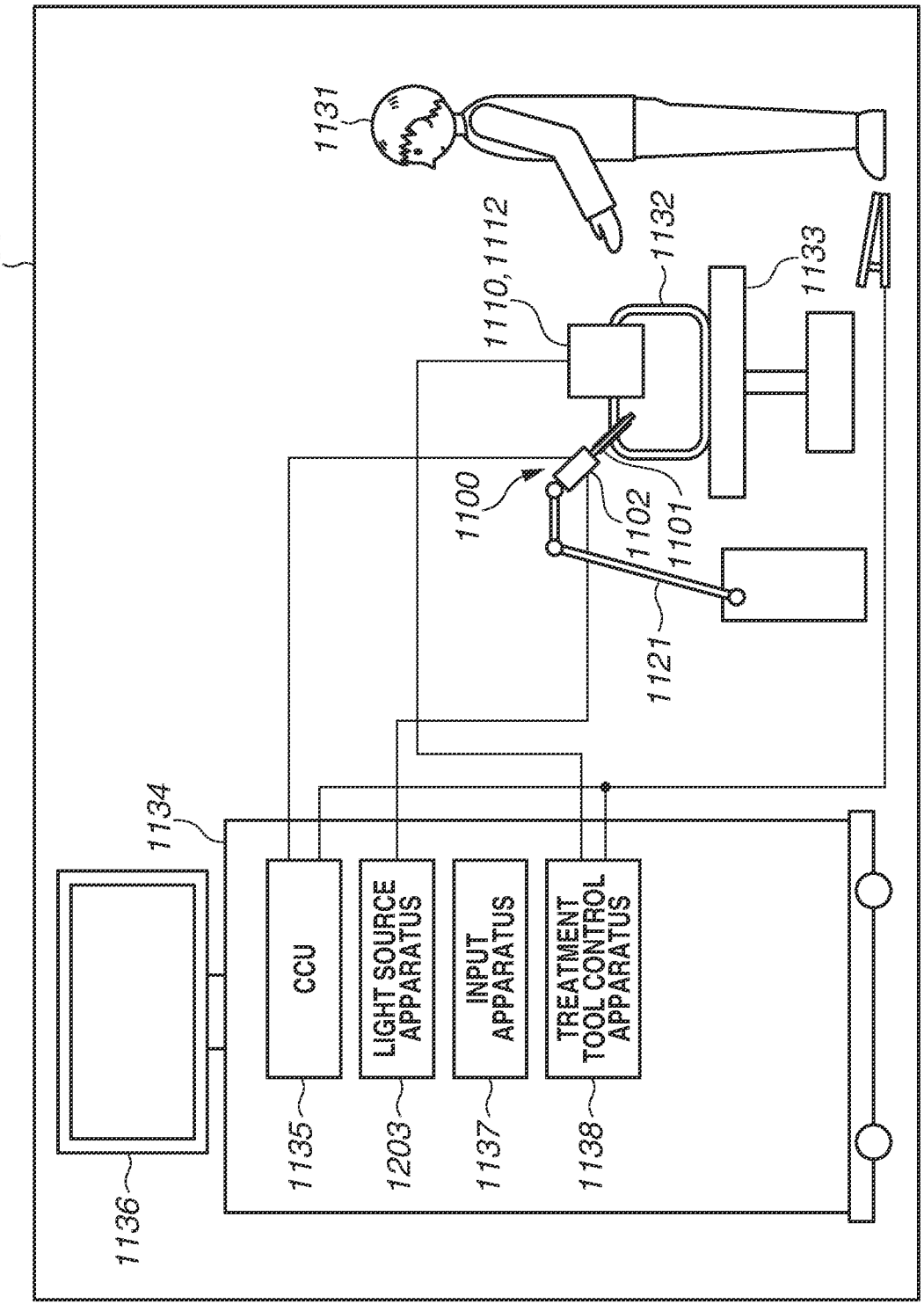
FIG. 17 is a functional block diagram of a photoelectric conversion system according to a seventh embodiment.

A seventh embodiment will be described below. A photoelectric conversion system according to the seventh embodiment will be described with reference to FIG. 17. FIG. 17 is a diagram illustrating an example of a schematic configuration of an endoscopic surgery system that is the photoelectric conversion system according to the present embodiment.

FIG. 17 illustrates a state where an operator (doctor) 1131 is performing an operation on a patient 1132 on a patient bed 1133 using an endoscopic surgery system 1150. As illustrated in the diagram, the endoscopic surgery system 1150 includes an endoscope 1100, a surgical tool 1110, and a cart 1134 on which various apparatuses for endoscopic surgery are mounted.

The endoscope 1100 includes a lens barrel 1101 and a camera head 1102 connected to the base end of the lens barrel 1101. A predetermined length of the lens barrel 1101 from the tip is inserted into a body cavity of the patient 1132. While the illustrated endoscope 1100 is configured as a hard endoscope including a hard lens barrel 1101, the endoscope 1100 may be configured as a flexible endoscope including a flexible lens barrel.

The tip of the lens barrel 1101 has an opening to which an object lens is fitted. A light source apparatus 1203 is connected to the endoscope 1100. Light generated by the light source apparatus 1203 is guided to the tip of the lens barrel 1101 by a light guide extended through the lens barrel 1101, and emitted toward an observation target in the body cavity of the patient 1132 via the object lens. The endoscope 1100 may be a direct view endoscope, an angled endoscope, or a side view endoscope.

An optical system and a photoelectric conversion apparatus are disposed in the camera head 1102. Reflected light (observation light) from the observation target is collected to the photoelectric conversion apparatus by the optical system. The photoelectric conversion apparatus photoelectrically converts the observation light to generate an electrical signal corresponding to the observation light, i.e., an image signal corresponding to an observation image. Any one of the photoelectric conversion apparatuses described in the foregoing embodiments can be used as the photoelectric conversion apparatus. The image signal is transmitted as raw data to a camera control unit (CCU) 1135.

The CCU 1135 includes a central processing unit (CPU) and a graphics processing unit (GPU), and controls operation of the endoscope 1100 and a display apparatus 1136 in a centralized manner. Moreover, the CCU 1135 receives the image signal from the camera head 1102, and applies various types of image processing for displaying an image based on the image signal, such as development processing (e.g. demosaicing processing), to the image signal.

The display apparatus 1136 displays the image based on the image signal to which the image processing has been applied by the CCU 1135, under the control of the CCU 1135.

The light source apparatus 1203 includes a light source such as a light-emitting diode (LED), and supplies illumination light in capturing an image of the surgical site to the endoscope 1100.

An input apparatus 1137 is an input interface for the endoscopic surgery system 1150. The user can input various types of information and instructions to the endoscopic surgery system 1150 via the input apparatus 1137.

A treatment tool control apparatus 1138 controls driving of an energy treatment tool 1112 for cauterizing or incising tissue or sealing blood vessels.

The light source apparatus 1203 that supplies the illumination light in capturing an image of the surgical site to the endoscope 1100 includes, for example, an LED, a laser light source, or a white light source combining these. A white light source including a combination of R, G, and B laser light sources can precisely control the output intensity and output timing of each color (each wavelength). The light source apparatus 1203 can thus adjust the white balance of the captured image. In such a case, images corresponding to respective colors R, G, and B can be captured in a time-division manner by irradiating the observation target with the laser beams from the R, G, and B, respective laser light sources in a time-division manner and controlling the driving of the image sensor in the camera head 1102 in synchronization with the irradiation timing. According to this method, a color image can be obtained without a color filter on the image sensor.

Moreover, the driving of the light source apparatus 1203 may be controlled to change the intensity of the output light at predetermined time intervals. A high dynamic range image without underexposure or overexposure can be generated by controlling the driving of the image sensor in the camera head 1102 in synchronization with the timing of changes in the light intensity to obtain images in a time-division manner and combining the images.

The light source apparatus 1203 may be configured so that light of a predetermined wavelength band intended for special light observation can be supplied. Special light observation uses the wavelength dependence of light absorption by body tissue, for example. Specifically, an image of predetermined tissue such as blood vessels in the mucosal surface layer is captured with high contrast by emitting light of a narrower band than that of the illumination light during normal observation (i.e., white light).

Alternatively, fluorescence observation for obtaining an image using fluorescence caused by excitation light irradiation may be performed as special light observation. Fluorescence observation includes irradiating body tissue with excitation light and observing fluorescence from the body tissue. A fluorescence image can be obtained by locally injecting a reagent such as indocyanine green (ICG) into body tissue and irradiating the body tissue with excitation light corresponding to the fluorescence wavelength of the reagent. The light source apparatus 1203 can be configured so that narrow-band light and/or excitation light intended for such a special light observation can be supplied.

Figure 18A:
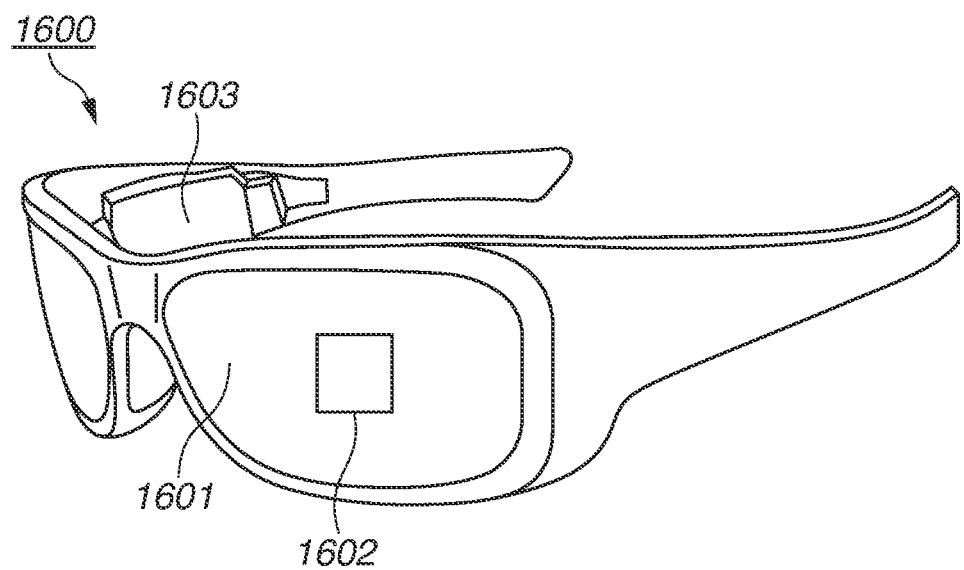
FIGS. 18A and 18B are each a schematic diagram of a photoelectric conversion system according to an eighth embodiment.

An eighth embodiment will be described below. A photoelectric conversion system according to the eighth embodiment will be described with reference to FIGS. 18A and 18B. FIG. 18A illustrates glasses 1600 (smart glasses) that are the photoelectric conversion system according to the present embodiment. The glasses 1600 include a photoelectric conversion apparatus 1602. The photoelectric conversion apparatus 1602 is any one of the photoelectric conversion apparatuses described in the foregoing embodiments. A display apparatus including a light emission device such as an organic light-emitting diode (OLED) and an LED may be disposed on the backside of a lens 1601. The glasses 1600 may include one or a plurality of photoelectric conversion apparatuses 1602. A plurality of types of photoelectric conversion apparatuses may be used in combination. The installation position of the photoelectric conversion apparatus 1602 is not limited to that illustrated in FIG. 18A.

The glasses 1600 further include a control apparatus 1603. The control apparatus 1603 functions as a power supply for supplying power to the photoelectric conversion apparatus 1602 and the display apparatus mentioned above. The control apparatus 1603 also controls operation of the photoelectric conversion apparatus 1602 and the display apparatus. The lens 1601 includes an optical system for collecting light to the photoelectric conversion apparatus 1602.

Figure 18B:
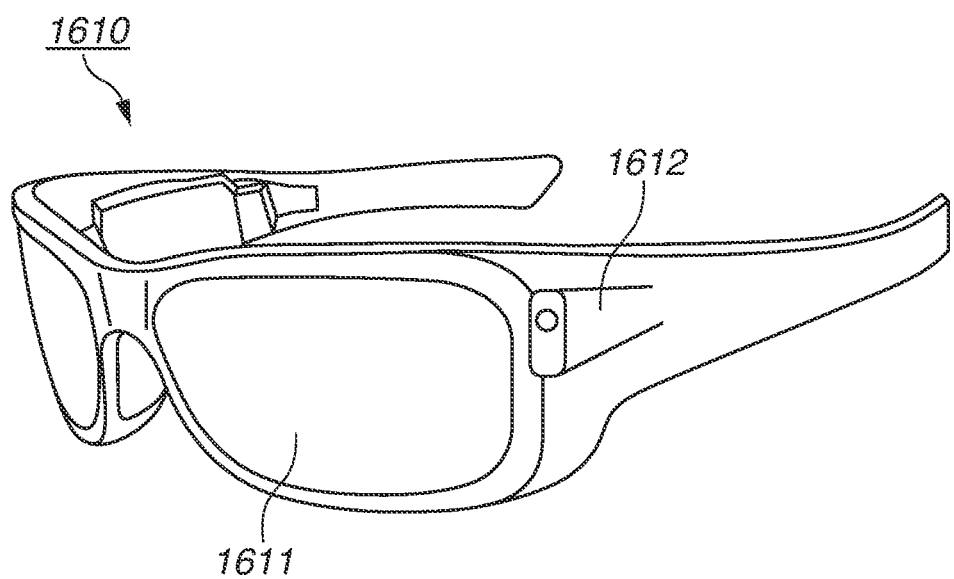

FIG. 18B illustrates glasses 1610 (smart glasses) according to an application example. The glasses 1610 include a control apparatus 1612. The control apparatus 1612 includes a photoelectric conversion apparatus equivalent to the photoelectric conversion apparatus 1602 and a display apparatus. A lens 1611 includes the optical system of the photoelectric conversion apparatus in the control apparatus 1612 and an optical system for projecting light emitted from the display apparatus, and an image is projected on the lens 1611. The control apparatus 1612 functions as a power supply for supplying power to the photoelectric conversion apparatus and the display apparatus, and controls operation of the photoelectric conversion apparatus and the display apparatus. The control apparatus 1612 may include a line of sight detection unit for detecting the line of sight of the wearer (user). The line of sight may be detected using infrared rays. An infrared emission unit emits infrared rays toward the eyeball of the user gazing at the projected image (display image). An imaging unit including a light receiving element detects the reflection of the emitted infrared rays from the eyeball to obtain a captured image of the eyeball. A reduction unit for reducing the infrared rays from the infrared emission unit to the lens 1611 in a plan view is included to reduce a drop in image quality.

The user's line of sight to the display image is detected from the captured image of the eyeball obtained by the infrared imaging. Any conventional technique is applicable to detect the line of sight from the captured image of the eyeball. For example, a line of sight detection method based on a Purkinje image obtained from the reflection of illumination light at the cornea is useable.

More specifically, line of sight detection processing based on a pupil-corneal reflection method is performed. Using the pupil-corneal reflection method, the user's line of sight is detected by calculating a line of sight vector representing the direction (rotation angle) of the eyeball based on the image of the pupil and the Purkinje image included in the captured image of the eyeball.

The display apparatus according to the present embodiment may include a photoelectric conversion apparatus including a light receiving element, and control the display image of the display apparatus based on the user's line of sight information from the photoelectric conversion apparatus.

Specifically, the display apparatus determines a first field of view region gazed at by the user and a second field of view region other than the first field of view region based on the line of sight information. The first field of view region and the second field of view region may be determined by the control unit of the display apparatus. The first and second field of view regions determined by an external control apparatus may be received. The display resolution of the first field of view region in the display area of the display apparatus may be controlled to be higher than that of the second field of view region. In other words, the resolution of the second field of view region may be made lower than that of the first field of view region.

The display area may include a first display region and a second display region different from the first display region, and one having the higher priority between the first and second display regions may be determined based on the line of sight information. The first display region and the second display region may be determined by the control unit of the display apparatus. The first and second display regions determined by an external control apparatus may be received. The resolution of the region having the higher priority may be controlled to be higher than that of the region other than that having the higher priority. In other words, the resolution of the region having the relatively lower priority may be reduced.

The first field of view region or the region having the higher priority may be determined using artificial intelligence (AI). The AI may be a model trained to estimate the angle of the line of sight and the distance to an object in front of the line of sight from the image of the eyeball, using images of eyeballs and the actual directions of sight of the eyeballs in the images as teaching data. An AI program may be included in the display apparatus, the photoelectric conversion apparatus, or an external apparatus. If the AI program is included in an external apparatus, the estimation result is notified to the display apparatus by communication.

If the display is controlled based on visual recognition detection, the present embodiment can be suitably applied to smart glasses further including a photoelectric conversion apparatus for capturing an external image. The smart glasses can display captured external information in real time.

Modified Embodiments

The present invention is not limited to the foregoing embodiments, and various modifications can be made.

For example, part of the configuration of one of the embodiments may be added to another embodiment, or replaced with part of the configuration of another embodiment. Such modifications are also included in the embodiments of the present invention.

The photoelectric conversion systems described in the foregoing fourth and fifth embodiments are examples of photoelectric conversion systems to which a photoelectric conversion apparatus is applicable. Photoelectric conversion systems to which a photoelectric conversion apparatus according to an embodiment of the present invention is applicable is not limited to the configurations illustrated in FIGS. 14 to 15B. The same applies to the ToF system described in the sixth embodiment, the endoscopic described in the seventh embodiment, and the smart glasses described in the eighth embodiment.

All the foregoing embodiments are merely examples of embodiment in carrying out the present invention, and the interpretation of the technical scope of the present invention should not be limited thereto.

While the present invention has been described with reference to embodiments, it is to be understood that the invention is not limited to the disclosed embodiments, but is defined by the scope of the following claims.

This application claims the benefit of Japanese Patent Application No. 2021-154431, filed Sep. 22, 2021, which is hereby incorporated by reference herein in its entirety.

What is claimed is:

1. A photoelectric conversion apparatus comprising an avalanche diode disposed in a semiconductor layer having a first surface and a second surface opposite the first surface,
    wherein the avalanche diode includes a first semiconductor region of first conductivity type disposed at a first depth and a second semiconductor region of second conductivity type disposed at a second depth deeper than the first depth with respect to the second surface,
    wherein an oxide film and a protective film stacked on the oxide film are disposed on the second surface of the semiconductor layer,
    wherein there is a point at which $d_{sio} > (\varepsilon_{sio}/\varepsilon_{prot}) \times d_{prot}/2$ is satisfied, where $d_{sio}$ is a thickness of the oxide film, $d_{prot}$ is a thickness of the protective film, $\varepsilon_{sio}$ is a relative permittivity of the oxide film, and $\varepsilon_{prot}$ is a relative permittivity of the protective film, and
    wherein there is a point at which the oxide film and the protective film satisfy $d_{sio} > (\varepsilon_{sio}/\varepsilon_{prot}) \times d_{prot}$.

2. The photoelectric conversion apparatus according to claim 1, wherein the protective film includes a nitride film.

3. The photoelectric conversion apparatus according to claim 2, wherein the nitride film is a silicon oxynitride film or a silicon nitride film.

4. The photoelectric conversion apparatus according to claim 1, where the protective film has a nitrogen content higher than a nitrogen content of the oxide film.

5. The photoelectric conversion apparatus according to claim 1, wherein the first surface is a light incident surface.

6. The photoelectric conversion apparatus according to claim 1, further comprising a third semiconductor region between the first semiconductor region and the second semiconductor region, the third semiconductor region being disposed in contact with the second semiconductor region.

7. The photoelectric conversion apparatus according to claim 6, wherein the first semiconductor region has an area smaller than an area of the third semiconductor region in a plan view from the second surface.

8. The photoelectric conversion apparatus according to claim 6, wherein the third semiconductor region has an impurity concentration lower than an impurity concentration of the first semiconductor region.

9. The photoelectric conversion apparatus according to claim 6, wherein there is a point at which the oxide film and the protective film satisfy $d_{sio} > (\varepsilon_{sio}/\varepsilon_{prot}) \times d_{prot}/2$ in a region overlapping the third semiconductor region in a plan view from the second surface.

10. The photoelectric conversion apparatus according to claim 6, wherein the thickness $d_{sio}$ of a region of the oxide film overlapping the third semiconductor region is greater than the thickness $d_{sio}$ of a region of the oxide film not overlapping the third semiconductor region in a plan view from the second surface.

11. The photoelectric conversion apparatus according to claim 6, further comprising:
    a first wiring portion electrically connected to the first semiconductor region; and
    a second wiring portion electrically connected to the second semiconductor region,
    wherein, in a plan view from the second surface, the second wiring portion overlaps with at least a part of the third semiconductor region and does not overlap with the first semiconductor region.

12. The photoelectric conversion apparatus according to claim 1, wherein the thickness $d_{sio}$ of the oxide film satisfies $d_{sio} > 30$ nm.

13. The photoelectric conversion apparatus according to claim 1, wherein the first semiconductor region falls within the second semiconductor region in a plan view from the second surface.

14. The photoelectric conversion apparatus according to claim 1, wherein there is a point at which the oxide film and the protective film satisfy $d_{sio} > (\varepsilon_{sio}/\varepsilon_{prot}) \times d_{prot}/2$ in a region overlapping an end of the first semiconductor region in a plan view from the second surface.

15. The photoelectric conversion apparatus according to claim 1, further comprising a fourth semiconductor region of the second conductivity type disposed at a third depth deeper than the second depth with respect to the second surface.

16. The photoelectric conversion apparatus according to claim 1,
    wherein the avalanche diode includes a first avalanche diode and a second avalanche diode adjoining the first avalanche diode, and
    wherein a first isolation portion is disposed between the first and second avalanche diodes.

17. The photoelectric conversion apparatus according to claim 16,
    wherein the avalanche diode includes a third avalanche diode adjoining the second avalanche diode,
    wherein a second isolation portion is disposed between the second and third avalanche diodes, and
    wherein the second semiconductor region in the second avalanche diode extends from the first pixel isolation portion to the second pixel isolation portion in a cross section perpendicular to the first surface.

18. The photoelectric conversion apparatus according to claim 1, wherein the oxide film includes a plurality of layers different in at least any one of a film forming method, a physical property, and a chemical composition.

19. The photoelectric conversion apparatus according to claim 18, wherein, among the plurality of layers, a layer close to the second surface is thinner than a layer far from the second surface.

20. The photoelectric conversion apparatus according to claim 18, wherein the plurality of layers includes an oxynitride film.

21. A photoelectric conversion system comprising:
    the photoelectric conversion apparatus according to claim 1; and
    a signal processing unit configured to generate an image using a signal output from the photoelectric conversion apparatus.

22. A movable body comprising:
    the photoelectric conversion apparatus according to claim 1; and a control unit configured to control movement of the movable body using a signal output from the photoelectric conversion apparatus.

23. The photoelectric conversion apparatus according to claim 1, further comprising:
a first wiring portion electrically connected to the first semiconductor region; and
a second wiring portion electrically connected to the second semiconductor region,
wherein, in a plan view from the second surface, the second wiring portion overlaps with at least a part of the second semiconductor region and does not overlap with the first semiconductor region.

24. A photoelectric conversion apparatus comprising:
an avalanche diode disposed in a semiconductor layer having a first surface and a second surface opposite the first surface;
a first wiring portion connected to the first semiconductor region; and
a second wiring portion connected to the second semiconductor region,
wherein the avalanche diode includes a first semiconductor region of first conductivity type disposed at a first depth and a second semiconductor region of second conductivity type disposed at a second depth deeper than the first depth with respect to the second surface,
wherein an oxide film and a protective film stacked on the oxide film are disposed on the second surface of the semiconductor layer,
wherein there is a point at which $d_{sio} > (\varepsilon_{sio}/\varepsilon_{prot}) \times d_{prot}/2$ is satisfied, where $d_{sio}$ is a thickness of the oxide film, $d_{prot}$ is a thickness of the protective film, $\varepsilon_{sio}$ is a relative permittivity of the oxide film, and $\varepsilon_{prot}$ is a relative permittivity of the protective film, and
wherein the first wiring portion has an area smaller than an area of the second wiring portion in a plan view from the second surface.

25. A photoelectric conversion apparatus comprising:
an avalanche diode disposed in a semiconductor layer having a first surface and a second surface opposite the first surface;
a fourth semiconductor region of the second conductivity type disposed at a third depth deeper than the second depth with respect to the second surface; and
a fifth semiconductor region of the first conductivity type between the second semiconductor region and the fourth semiconductor region,
wherein the avalanche diode includes a first semiconductor region of first conductivity type disposed at a first depth and a second semiconductor region of second conductivity type disposed at a second depth deeper than the first depth with respect to the second surface,
wherein an oxide film and a protective film stacked on the oxide film are disposed on the second surface of the semiconductor layer,
wherein there is a point at which $d_{sio} > (\varepsilon_{sio}/\varepsilon_{prot}) \times d_{prot}/2$ is satisfied, where $d_{sio}$ is a thickness of the oxide film, $d_{prot}$ is a thickness of the protective film, $\varepsilon_{sio}$ is a relative permittivity of the oxide film, and $\varepsilon_{prot}$ is a relative permittivity of the protective film, and
wherein the fifth semiconductor region has an impurity concentration of the first conductivity type lower than an impurity concentration of the first conductivity type of the first semiconductor region.

26. The photoelectric conversion apparatus according to claim 25, wherein a potential difference between the first and second semiconductor regions is greater than a potential difference between the second and fifth semiconductor regions.

* * * * *